US012588373B2

(12) United States Patent
Lee et al.

(10) Patent No.:    US 12,588,373 B2
(45) Date of Patent:        Mar. 24, 2026

(54) DISPLAY DEVICE, AND METHOD FOR FABRICATING DISPLAY DEVICE

(71) Applicant: Samsung Display Co., Ltd., Yongin-Si (KR)

(72) Inventors: Kye Uk Lee, Seoul (KR); Soo Hong Cheon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 791 days.

(21) Appl. No.: 17/682,567

(22) Filed: Feb. 28, 2022

(65) Prior Publication Data

US 2022/0285598 A1        Sep. 8, 2022

(30) Foreign Application Priority Data

Mar. 2, 2021    (KR) ........................ 10-2021-0027305

(51) Int. Cl.
| | |
|---|---|
| *H10K 59/131* | (2023.01) |
| *H10H 20/831* | (2025.01) |
| *H10H 20/851* | (2025.01) |
| *H10H 20/854* | (2025.01) |
| *H10H 20/857* | (2025.01) |
| *H10K 59/80* | (2023.01) |
| *H10H 20/01* | (2025.01) |

(52) U.S. Cl.
CPC ......... *H10K 59/131* (2023.02); *H10H 20/831* (2025.01); *H10H 20/851* (2025.01); *H10H 20/854* (2025.01); *H10H 20/857* (2025.01);

*H10K 59/87* (2023.02); *H10H 20/032* (2025.01); *H10H 20/0362* (2025.01); *H10H 20/0364* (2025.01)

(58) Field of Classification Search
CPC .......................... H10K 59/131; H10K 59/1275
See application file for complete search history.

(56) References Cited

U.S. PATENT DOCUMENTS

| | | | |
|---|---|---|---|
| 7,403,257 B2 | 7/2008 | Shin et al. | |
| 8,717,661 B2 | 5/2014 | Kawai | |
| 11,342,525 B2 | 5/2022 | Kim et al. | |
| 2010/0245271 A1* | 9/2010 | Park ................... | H10K 59/8722 |
| | | | 345/173 |
| 2014/0183530 A1* | 7/2014 | Yamazaki ........... | H01L 29/7869 |
| | | | 257/43 |
| 2014/0254119 A1* | 9/2014 | Im .............................. | C09J 9/02 |
| | | | 361/767 |

(Continued)

FOREIGN PATENT DOCUMENTS

| | | | | | |
|---|---|---|---|---|---|
| CN | 106405892 A | * | 2/2017 | .......... | G02F 1/1303 |
| JP | 2005043433 A | * | 2/2005 | | |

(Continued)

*Primary Examiner* — Michele Fan
(74) *Attorney, Agent, or Firm* — Innovation Counsel LLP

(57) ABSTRACT

A display device and a method for fabricating a display device are provided. The display device includes a display panel, a printed circuit film, and an adhesive member interposed between the display panel and the printed circuit film, wherein the display panel comprises an insulating layer and a plurality of grooves overlapping with the adhesive member in a thickness direction of the display device and disposed on a surface of the insulating layer, and wherein the plurality of grooves is filled with the adhesive member.

15 Claims, 15 Drawing Sheets

(56)            References Cited

U.S. PATENT DOCUMENTS

| | | | |
|---|---|---|---|
| 2019/0025634 A1* | 1/2019 | Park | G02F 1/133377 |
| 2020/0161579 A1* | 5/2020 | Kim | H10K 59/126 |

FOREIGN PATENT DOCUMENTS

| | | | |
|---|---|---|---|
| JP | 2007-57585 A | | 3/2007 |
| JP | 4370994 B2 | * | 11/2009 |
| KR | 10-2005-0044183 A | | 5/2005 |
| KR | 10-2010-0056037 A | | 5/2010 |
| KR | 10-2020-0058665 A | | 5/2020 |

* cited by examiner

PA1: AD_R, FB_R, UE_R1

PA1: AD_R, FB_R, UE_R1, UE_R2

PA1: AD_R, FB_R, UE_R1, UE_R2

PA1: AD_R, FB_R, UE_R1

PA1: AD_R, FB_R, UE_R1

PA1: AD_R, FB_R, UE_R1

PA1: AD_R, FB_R, UE_R1

PA1: AD_R, FB_R, UE_R1

PA1: AD_R, FB_R, UE_R1

DISPLAY DEVICE, AND METHOD FOR FABRICATING DISPLAY DEVICE

CROSS-REFERENCE TO RELATED APPLICATION

This application claims priority from Korean Patent Application No. 10-2021-0027305 filed on Mar. 2, 2021 in the Korean Intellectual Property Office, the disclosure of which is incorporated herein by reference in its entirety.

BACKGROUND

1. Field

The present disclosure relates to a display device. More particularly, the present disclosure relates to a display device capable of improving the adhesive force of an adhesive member and a method of fabricating the same.

2. Description of the Related Art

Display devices become more and more important as multimedia technology evolves. Accordingly, a variety of types of display devices such as liquid-crystal display (LCD) devices and organic light-emitting display (OLED) devices are currently used.

In a display device, a display panel where light-emitting elements are disposed, a display driving integrated circuit for driving the light-emitting elements, a printed circuit film attached to the display panel, etc. are mounted. They may be electrically connected with one another by an adhesive member such as an anisotropic conductive film. In designing such a display device, it is important that an anisotropic conductive film is adhered with a sufficiently strong adhesive force to prevent the issue of reliability or driving failure.

SUMMARY

Aspects of the present disclosure provide a display device capable of improving the adhesive force of an adhesive member.

Aspects of the present disclosure also provide a method for fabricating the display device.

It should be noted that objects of the present disclosure are not limited to the above-mentioned object; and other objects of the present disclosure will be apparent to those skilled in the art from the following descriptions.

According to an embodiment of the present disclosure, there is provided a display device comprising: a display panel; a printed circuit film; and an adhesive member interposed between the display panel and the printed circuit film, wherein the display panel includes an insulating layer and a plurality of grooves overlapping with the adhesive member in a thickness direction of the display device and disposed on a surface of the insulating layer, and wherein each of the plurality of grooves is filled with the adhesive member.

According to an embodiment of the present disclosure, there is provided a display device comprising: a display panel; a printed circuit film; and an adhesive member interposed between the display panel and the printed circuit film, wherein the display panel includes a pad electrode, and a first pattern region that overlaps the adhesive member in a thickness direction of the display device, spaced apart from the pad electrode in a plan view and having a concave-convex surface.

According to an embodiment of the present disclosure, there is provided method for fabricating a display device a display device comprising steps of: forming a plurality of grooves on a surface of an insulating layer of a display panel; disposing an adhesive member on a plurality of pad electrodes and the plurality of grooves of the display panel; and attaching the display panel with a printed circuit board by the adhesive member.

According to an embodiment of the present disclosure, it is possible to prevent the issue of reliability or driving failure which may occur when the adhesive member deviates.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the accompanying drawings.

Figure 1:
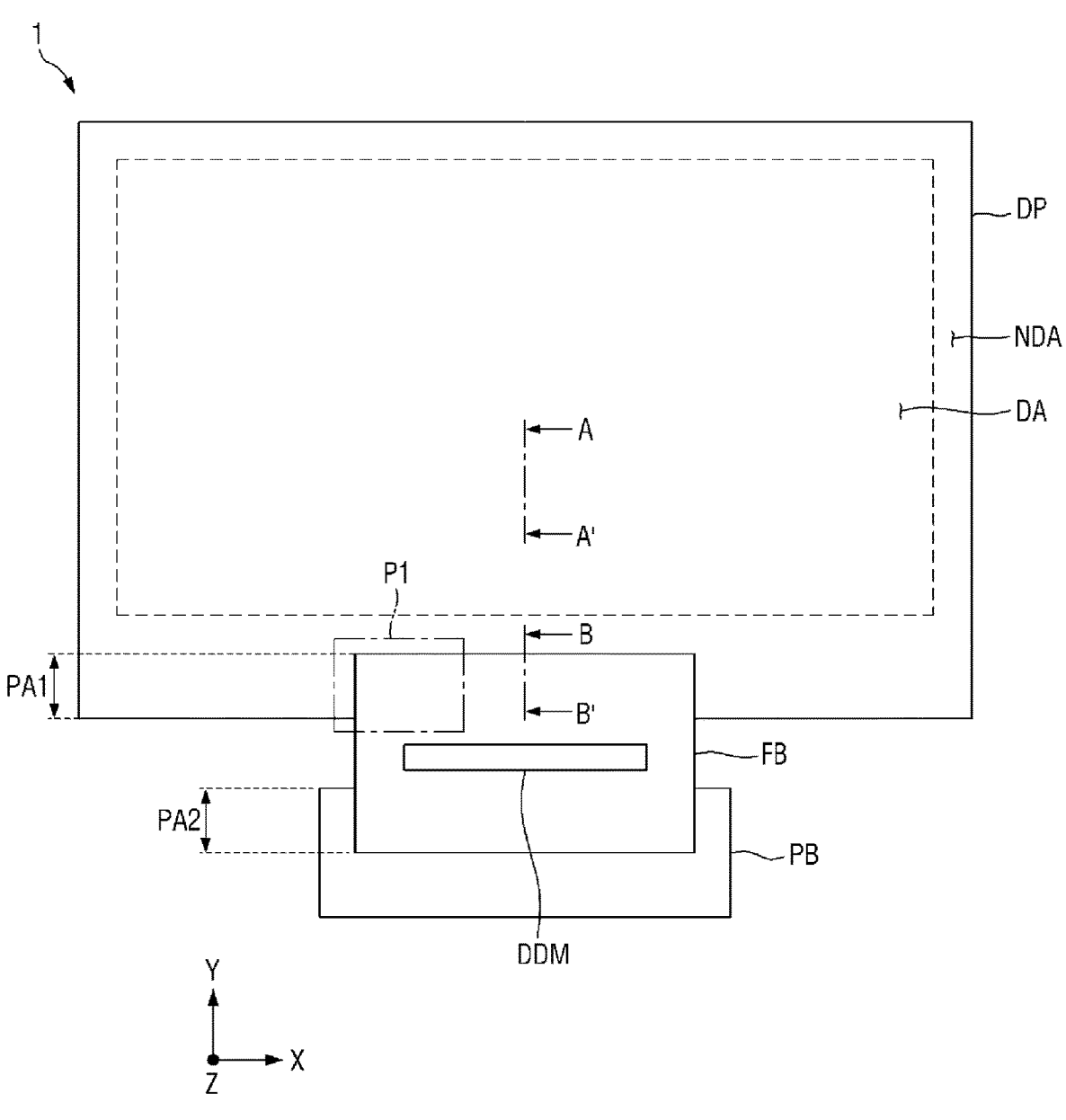
FIG. 1 is a plan view of a display device according to an embodiment of the present disclosure.

FIG. 1 is a plan view of a display device according to an embodiment of the present disclosure.

In the following description, a first direction X, a second direction Y and a third direction Z are different directions and cross one another. For example, the first direction X may be a width direction, the second direction Y may be a length direction, and the third direction Z may be a thickness direction and/or a height direction. The first direction X, the second direction Y and/or the third direction Z may refer to the directions indicated by arrows in the drawings, respectively. It is, however, to be understood that the present disclosure is not limited thereto. The first direction X, the second direction Y and the third direction Z may refer to the opposite directions to the directions indicated by the arrows in the drawings, respectively. For example, the third direction Z may include an upward direction toward the upper side of the drawings, and a downward direction toward the lower side of the drawings. In this instance, one surface of an element that faces the upper side may be referred to as an upper surface, while the opposite surface of the element that faces the lower side may be referred to as a lower surface. The upward direction, the downward direction, the upper surface and the lower surface may be referred to as a front direction, a rear direction, a front surface and a rear surface, respectively. It is to be noted that the directions and names are relative and are not limited by those described above.

A display device 1 displays moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

Referring to FIG. 1, a display device 1 may include a display panel DP for displaying images, a printed circuit board FB connected to the display panel DP, and a main circuit board PB connected to the printed circuit board FB.

The display panel DP may have a generally rectangular shape when viewed from the top. For example, the display panel DP may have two longer sides in the first direction X and two shorter sides in the second direction Y when viewed from the top, but the general shape of the display panel DP is not limited thereto. Although the corners of the display panel DP have a sharp shape in the plan view of FIG. 1, the corners of the display panel DP may be rounded.

An organic light-emitting display panel may be employed as the display panel DP. In the following description, an organic light-emitting display panel is employed as the display panel DP. It should be understood that the present disclosure is not limited thereto. Other types of display panels such as a liquid-crystal display (LCD) panel, a quantum-dot organic light-emitting display (QD-OLED) panel, a quantum-dot liquid-crystal display (QD-LCD) panel, a quantum-nano light-emitting display (Nano NED) panel and a micro LED panel may be employed as the display panel.

The display panel DP may include a display area DA including a plurality of pixels (not shown), and a non-display area NDA disposed around the display area DA.

In the display area DA, images and videos may be displayed. The display area DA may have a generally rectangular shape when viewed from the top, but the present disclosure is not limited thereto. The display area DA may have other shapes such as a circle, an ellipse, and etc.

The non-display area NDA may be disposed around the display area DA. The non-display area NDA may be disposed to surround at least a part of the display area DA. According to an embodiment of the present disclosure, the non-display area NDA may be disposed in a band shape that surrounds the border of the display area DA when viewed from the top. It should be understood that the present disclosure is not limited thereto.

The display panel DP may further include a first connection area PA1 disposed in the non-display area NDA. That is, the first connection area PA1 is disposed in the non-display area NDA and does not overlap the display area DA.

The first connection area PA1 may be disposed at an edge of the display panel DP. In the first connection area PA1, a pad electrode PE may be disposed, which will be described later. For example, the first connection area PA1 may be disposed on the lower shorter side of the display panel DP. Specifically, the first connection area PA1 may be disposed in the non-display area NDA between the display area DA and the lower shorter side when viewed from the top. It should be understood that the present disclosure is not limited thereto. The first connection area PA1 may be disposed on the upper shorter side, the left longer side, or the right longer side of the display panel DP.

The printed circuit board FB may be attached to the display panel DP. The printed circuit board FB may be attached to the display panel DP by an adhesive member AD, which will be described later. The printed circuit board FB may connect the display panel DP with the main circuit board PB. One end of the printed circuit board FB may be connected to the display panel DP, and the other end of the printed circuit board FB may be connected to the main circuit board PB.

The printed circuit board FB may be attached to the first connection area PA1. The printed circuit board FB may include a rigid printed circuit board FB and a flexible printed circuit board FB. According to an embodiment of the present disclosure, the printed circuit board FB may be, but is not limited to, a film-type flexible printed circuit board FB having a thin thickness.

The display device 1 may further include a driving member DDM that drives a plurality of pixels of the display panel DP.

The driving member DDM may include an integrated circuit for driving the plurality of pixels. According to an embodiment of the present disclosure, the driving member DDM may be, for example, a display driving integrated circuit, but the present disclosure is not limited thereto.

According to an embodiment of the present disclosure, the driving member DDM is mounted on the printed circuit board FB by, but is not limited to, the chip on film (COF) technique. The driving member DDM may be mounted directly on the display panel DP by chip on plastic (COP) technique, the chip on glass (COG) technique, etc.

The main circuit board PB may be connected to the opposite side of the printed circuit board FB. The main circuit board PB may include a second connection area PA2 to which the printed circuit board FB is electrically connected. It should be understood that the present disclosure is not limited thereto. The main circuit board PB and/or the elements mounted on the main circuit board PB may be mounted directly on the display panel DP.

Figure 2:
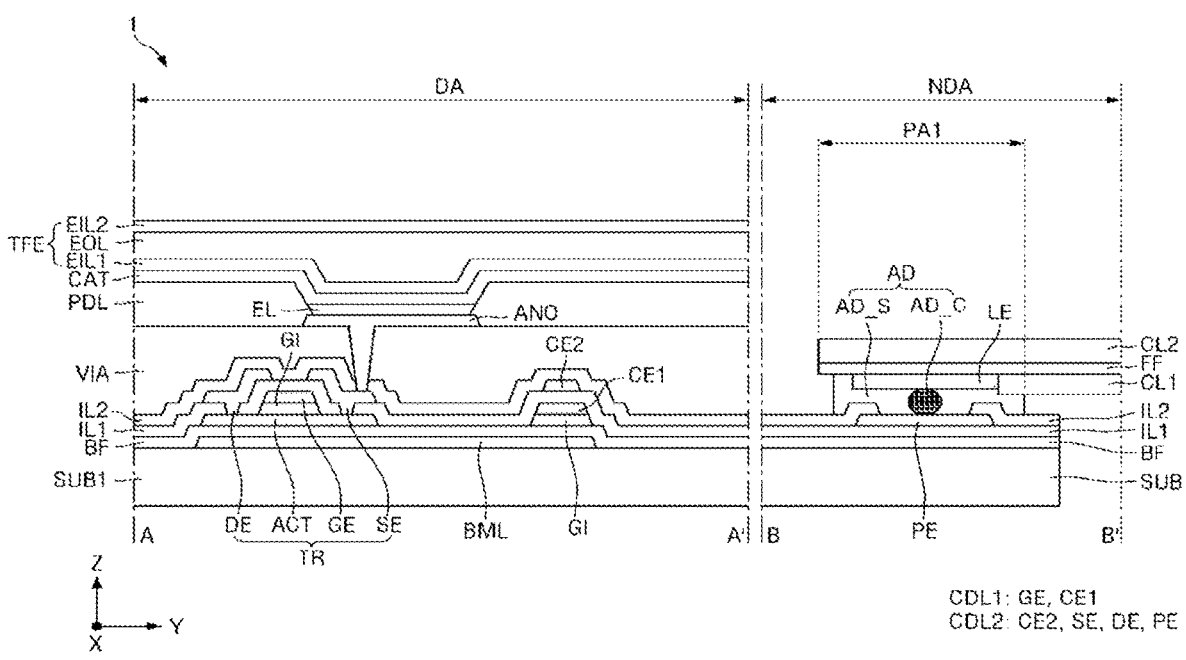
FIG. 2 is a cross-sectional view taken along lines A-A' and B-B' of FIG. 1.

FIG. 2 is a cross-sectional view taken along lines A-A' and B-B' of FIG. 1.

Referring to FIGS. 1 and 2, the display device 1 may further include a first substrate SUB1, a plurality of conductive layers BML, CDL1 and CDL2, a plurality of insulating layers GI, IL1, IL2 and VIA for insulating them from one another, and an emissive layer EL.

The first substrate SUB1 may be disposed across the display area DA and the non-display area NDA. The first substrate SUB1 may serve to support a variety of elements disposed thereon. The first substrate SUB1 may be a rigid substrate containing a rigid material such as flexible glass and quartz, or a flexible substrate containing a flexible material such as polyimide (PI).

A bottom conductive layer BML may be disposed on the first substrate SUB1. The bottom conductive layer BML may be disposed between the first substrate SUB1 and a buffer layer BF.

At least a part of the bottom conductive layer BML may overlap a semiconductor layer ACT, a first conductive layer CDL1, a second conductive layer CDL2 and/or an anode electrode ANO in the thickness direction (Z-direction). As shown in FIG. 2, the width of the bottom conductive layer BML may be equal to or greater than the width of the semiconductor layer ACT and the width of the first electrode CE1 in the cross-section, and may overlap with the semiconductor layer ACT, the elements stacked on the semiconductor layer ACT, the first electrode CE1 and the elements stacked on the first electrode CE1 in the thickness direction. It should be understood that the present disclosure is not limited thereto. The width of the bottom conductive layer BML may be less than or equal to the width of the semiconductor layer ACT or the width of the first electrode CE1 in the cross-section.

The bottom conductive layer BML may include a metal. The bottom conductive layer BML may include, but is not limited to, a material substantially the same as or similar to that of the first conductive layer CDL1 to be described later.

The bottom conductive layer BML may be electrically connected to at least one of the plurality of conductive layers BML, CDL1 and CDL2. The bottom conductive layer BML may serve as electrodes and/or lines for driving the display panel DP, such as data lines, scan lines, voltage electrodes and capacitor electrodes, for example. The bottom conductive layer BML can block light incident on the semiconductor layer ACT from the first substrate SUB1. The bottom conductive layer BML may be eliminated. Although not shown in the drawings, a source electrode SE, which will be described later, may penetrate through at least one insulating layer to be electrically connected to the bottom conductive layer BML.

A buffer layer BF may be disposed on the first substrate SUB1. The buffer layer BF can prevent permeation of moisture and oxygen from the outside through the first substrate SUB1. The buffer layer BF may include, but is not limited to, one of a silicon nitride (SiNx) film, a silicon oxide (SiO$_2$) film, and a silicon oxynitride (SiOxNy) film.

The semiconductor layer ACT may be disposed on the buffer layer BF. The semiconductor layer ACT may form a channel of the thin-film transistor TR. The semiconductor layer ACT may be disposed in each pixel of the display area DA, and may be disposed in the non-display area NDA in some implementations. The semiconductor layer ACT may include source/drain regions and an active region. For example, the semiconductor layer ACT may include polycrystalline silicon. For another example, the semiconductor layer ACT may include oxide semiconductor. The oxide semiconductor may include, for example, at least one of In, Ga, Zn, Sn, Hf, Si, N and Al, or a compound in which two or more thereof are combined. As another example, the semiconductor layer ACT may include a metal oxide such as indium gallium zinc oxide (IGZO). It is to be noted that the material of the semiconductor layer ACT is not limited to the examples listed above. Although the semiconductor layer ACT is illustrated as a single layer in FIG. 2, the present disclosure is not limited thereto. The semiconductor layer ACT may include two or more layers.

The gate insulator GI may be disposed on the semiconductor layer ACT. The gate insulator GI may be interposed between the semiconductor layer ACT and the gate electrode GE. The gate insulator GI may insulate the gate electrode GE. The gate insulator GI may be further interposed between the buffer layer BF and the first electrode CE1. The gate insulator GI may have substantially the same width as the lower portion of the gate electrode GE and/or the first electrode CE1 in cross section, and may be disposed only between the semiconductor layer ACT and the gate electrode GE and/or between the buffer layer BF and the first electrode CE1. It should be understood that the present disclosure is not limited thereto. The gate insulator GI may be disposed throughout the entire surface of the first substrate SUB1.

The gate insulator GI may include a silicon compound, a metal oxide, etc. For example, the gate insulator GI may include silicon oxide, silicon nitride, silicon oxynitride, aluminum oxide, tantalum oxide, hafnium oxide, zirconium oxide, titanium oxide, etc. They may be used alone or in combinations. It should be understood that the present disclosure is not limited thereto.

The first conductive layer CDL1 may be disposed on the gate insulator GI. The first conductive layer CDL1 may include a gate electrode GE and a first electrode CE1 of a storage capacitor.

The first conductive layer CDL1 may include a metal. For example, the first conductive layer CDL1 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer CDL1 may be made up of a single film or multiple films of the above-listed materials.

A first insulating layer IL1 may be disposed on the buffer layer BF and the first conductive layer CDL1. The first insulating layer IL1 may insulate the first conductive layer CDL1 from the second conductive layer CDL2. The first insulating layer IL1 may include an inorganic insulating material. For example, the first insulating layer IL1 may be selected from among the materials listed above as the material for the gate insulator GI, but the present disclosure is not limited thereto.

The second conductive layer CDL2 may be disposed on the first insulating layer ILL The second conductive layer CDL2 may be electrically connected to the bottom conductive layer BML, the first conductive layer CDL1 and/or the anode electrode ANO. As will be described later, the second conductive layer CDL2 may be simultaneously formed using a single mask.

The second conductive layer CDL2 may include a metal. The second conductive layer CDL2 may include the same material as or a similar material to that of the first conductive layer CDL1. For example, the second conductive layer CDL2 may include, but is not limited to, at least one selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu) and indium tin oxide (ITO).

The second conductive layer CDL2 may be made up of a single film or multiple films made of the above-listed materials. For example, the second conductive layer CDL2 may have a stack structure of Ti/Cu/ITO. It should be understood that the present disclosure is not limited thereto. The second conductive layer CDL2 may have a variety of stack structures, including Ti/Al/Ti, Mo/Al/Mo, Mo/AlGe/Mo, Ti/Cu, etc.

The second conductive layer CDL2 may include a source electrode SE, a drain electrode DE, a second electrode CE2 of a storage capacitor, and a pad electrode PE. Although not shown in the drawings, the second conductive layer CDL2 may further include, for example, voltage electrodes applying voltages for driving the display panel DP, such as a high-level voltage electrode and a low-level voltage electrode, or may be electrically connected to them.

Each of the source electrode SE and the drain electrode DE may penetrate through the second conductive layer CDL2 to be connected to the semiconductor layer ACT. The semiconductor layer ACT, the gate electrode GE, the source electrode SE and the drain electrode DE may form the thin-film transistor TR. For example, the thin-film transistor TR may be a driving transistor that drives each pixel of the display panel. It should be understood that the present disclosure is not limited thereto. The thin-film transistor TR may be a switching transistor for controlling whether to drive each pixel or a sensing transistor for sensing a threshold voltage. In such case, the source electrode SE of the switching transistor or the sensing transistor may not be directly connected to the anode electrode ANO.

The first electrode CE1, the second electrode CE2 and the bottom conductive layer BML may be disposed such that they overlap each other at least partially in the thickness direction. Two or more of the first electrode CE1, the second electrode CE2 and the bottom conductive layer BML may form a storage capacitor. For example, the bottom conductive layer BML, the semiconductor layer ACT and the source electrode SE/drain electrode SE may form the storage capacitor. As another example, the bottom conductive layer BML, the semiconductor layer ACT and the anode electrode ANO may form the storage capacitor.

The second insulating layer IL2 may be disposed on the second conductive layer CDL2.

The second insulating layer IL2 may include an inorganic insulating material. The second insulating layer IL2 may include a silicon compound, a metal oxide, etc. For example, the second insulating layer IL2 may include silicon oxide, silicon nitride, silicon oxynitride, aluminum oxide, tantalum oxide, hafnium oxide, zirconium oxide, titanium oxide, and a combination thereof. They may be used alone or in combinations. As another example, the third insulating layer may be made mainly of phosphorus-doped vapor deposited silicon (PVX). It should be understood that the present disclosure is not limited thereto. The second insulating layer IL2 may include an organic insulating material forming a via layer VIA to be described later.

The via layer VIA may be disposed on the second insulating layer IL2. The via layer VIA may be a planarization layer. The via layer VIA may include an organic insulating material. The organic insulating material may include, but is not limited to, at least one of: polyacrylate resin, epoxy resin, phenolic resin, polyamide resin, polyimide resin, unsaturated polyesters resin, polyphenylene ether resin, polyphenylene sulfide resin, benzocyclobutene (BCB), etc.

The anode electrode ANO may be disposed on the via layer VIA. The anode electrode ANO may be electrically connected to the source electrode SE through a contact hole penetrating through the via layer VIA and the second insulating layer IL2.

A pixel-defining layer PDL may be disposed over the anode electrode ANO. The pixel-defining layer PDL may include a contact hole exposing the anode electrode ANO. As shown in FIG. 2, the pixel-defining layer PDL covers the end of the anode electrode ANO in the cross-section to prevent migration of the anode electrode ANO.

The pixel-defining layer PDL may include an organic insulating material or an inorganic insulating material. For example, the pixel-defining layer PDL may include, but is not limited to, at least one of: a photoresist, a polyimide resin, an acrylic resin, a silicon compound, a polyacrylic resin, and the like.

The emissive layer EL may be disposed on the upper surface of the anode ANO and in the opening of the pixel-defining layer PDL. The emissive layer EL may include an organic compound that emits light in response to the flow of electric current.

A cathode electrode CAT is disposed on the emissive layer EL and the pixel-defining layer PDL. The cathode electrode CAT may be a common electrode disposed across a plurality of pixels.

The thin-film encapsulation layer TFE may be disposed on the cathode electrode CAT. The thin-film encapsulation layer TFE can encapsulate the elements stacked under the thin-film encapsulation layer TFE to prevent permeation of moisture and air.

The thin-film encapsulation layer TFE may be implemented as a stack of inorganic films and organic films alternately stacked on one another. For example, the thin-film encapsulation layer TFE may include a first inorganic encapsulation film EIL1, an organic encapsulation film EOL and a second inorganic encapsulation film EIL2 stacked on one another sequentially. The first inorganic encapsulation film EIL1 and the second inorganic encapsulation film EIL2 may include the above-described inorganic insulating material, and the organic encapsulation film EOL may include the above-described organic insulating material. It should be understood that the present disclosure is not limited thereto.

Although not shown in the drawings, the display device 1 may further include a panel bottom sheet disposed under the display panel DP. The panel bottom sheet may be attached to the rear surface of the display panel DP. The panel bottom sheet includes at least one functional layer. The functional layer may perform a heat dissipation function, an electromagnetic wave shielding function, a grounding function, a buffering function, a strength enhancing function, a supporting function, and/or a digitizing function. The functional layer may be a sheet layer made of a sheet, a film layer made of a film, a thin film layer, a coating layer, a panel, a plate, etc. A single functional layer may be made up of a single layer or a plurality of thin films or coating layers stacked on one another. The functional layer may be, for example, a supporting substrate, a heat-radiating layer, an electromagnetic wave shielding layer, a shock absorbing layer, a digitizer, etc.

The display device 1 may have different stack structures in the display area DA and the non-display area NDA, for example, the first connection area PA1. As shown on the right hand of FIG. 2, at least one of the plurality of conductive layers BML, CDL1 and CDL2 and at least one of the plurality of insulating layers GI, IL1, IL2 and VIA may be removed or eliminated from the first connection area PA1 connected to the printed circuit board FB or a nearby area. It should be understood that the present disclosure is not limited thereto. The plurality of conductive layers BML, CDL1 and CDL2 and the plurality of insulating layers GI, IL1, IL2 and VIA may not be eliminated in the non-display area NDA, for example, the first connection area PA1.

According to an embodiment of the present disclosure, a buffer layer BF, a first insulating layer IL1 and a second insulating layer IL2 may be sequentially stacked on a substrate in the first connection area PA1. In such case, the structure stacked on the second insulating layer IL2 may be removed or eliminated. In addition, a structure interposed between the first insulating layer IL1 and the second insulating layer IL2 may be removed or eliminated except the pad electrode PE. It should be understood that the present disclosure is not limited thereto. Although not shown in the drawings, the via layer VIA may not be eliminated from the first connection area PA1 but may be disposed on the second insulating layer IL2.

The pad electrode PE may be interposed between the first insulating layer IL1 and the second insulating layer IL2. A contact hole may be formed in the second insulating layer IL2 to expose the pad electrode PE. The second insulating layer IL2 may be disposed to cover an end of the pad electrode PE in cross section.

However, the stack structure in the first connection area PA1 is not limited thereto. At least one layer may be further interposed between the first insulating layer IL1 and the second insulating layer IL2. For example, a signal line electrically connected to at least one of the plurality of conductive layers BML, CDL1 and CDL2 may be disposed in the first connection area PA1. The signal line may be connected to the pad electrode PE through a contact hole penetrating the layer interposed between the signal line and the pad electrode PE. Furthermore, a layer stacked on the pad electrode PE and exposing a part of the pad electrode PE may be the first insulating layer IL1 or may be a separate insulating layer different from the first insulating layer IL1 or the second insulating layer IL2. For example, the insulating layer may be, but is not limited to, the via layer VIA.

The pad electrode PE may be made of the same material as at least one of the source electrode SE and the drain electrode DE. The pad electrode PE may be simultaneously formed with at least one of the source electrode SE and the drain electrode DE. For example, the pad electrode PE, the source electrode SE and the drain electrode DE may be formed via a single deposition process using the same mask. It should be understood that the present disclosure is not limited thereto. The pad electrode PE may be formed simultaneously with the bottom conductive layer BML or the first conductive layer CDL1.

Referring to FIGS. 1 and 2, the printed circuit board FB may include a lead electrode LE.

The lead electrode LE may be disposed to overlap the pad electrode PE in the thickness direction (Z-direction) in cross section. Conductive particles AD_C of an adhesive member AD, which will be described later, may be interposed between the pad electrode PE and the lead electrode LE to electrically connect them.

The printed circuit board FB may further include a base film FF, a first coating layer CL1 laminated on one surface of the base film FF facing the display panel DP, and a second coating layer CL2 laminated on the other surface of the base film FF opposite to the one surface of the base film FF.

The base film FF, the first coating layer CL1 and the second coating layer CL2 may be made of an insulating material having flexibility. The first coating layer CL1 may be disposed to expose the lead electrode LE on the one surface of the base film FF, and the second coating layer CL2 may be disposed to completely cover the opposite surface of the base film FF. It should be understood that the present disclosure is not limited thereto.

As described above, the printed circuit board FB may be attached to the first connection area PA1 of the display panel DP by the adhesive member AD. The adhesive member AD may electrically connect the lead electrode LE with the pad electrode PE.

The adhesive member AD may include an insulating base resin AD_S including a thermoplastic material or a thermosetting material, and a plurality of conductive particles AD_C dispersed in the base resin AD_S and having a fine size. In this embodiment, one conductive particle AD_C is shown in FIG. 2. The adhesive member AD may be, for example, an anisotropic conductive film, but the present disclosure is not limited thereto. Although not shown in the drawings, the pad electrode PE and the lead electrode LE may be directly bonded by ultrasonic bonding. In such case, the conductive particles AD_C may be eliminated.

In the first connection area PA1, the display panel DP, the printed circuit board FB, and the adhesive member AD may overlap one another in the thickness direction (Z-direction). In the first connection area PA1, the pad electrode PE, the lead electrode LE, and the conductive particles AD_C of the adhesive member AD may overlap one another in the thickness direction (Z-direction). The first connection area PA1 may refer to an area where all of the display panel DP, the printed circuit board FB and the adhesive member AD overlap one another in the thickness direction (Z-direction), and an area where two or more of the display panel DP, the printed circuit board FB and the adhesive member AD overlap one another in the thickness direction (Z-direction). Although not shown in the drawings, the connection relationship between the printed circuit board FB and the main circuit board PB may be substantially the same as or similar to the connection relationship between the display panel DP and the printed circuit board FB. That is, the printed circuit board FB may be attached in a manner substantially the same as or similar to the manner in which the display panel DP and the printed circuit board FB are attached together using an adhesive member AD, which will be described later. The second connection area PA2 may have a structure substantially the same as or similar to that of the first connection area PA1. In the second connection area PA2, the printed circuit board FB, the main circuit board PB and the adhesive member AD overlap one another in the thickness direction. In the second connection area PA2, all of the printed circuit board FB, the main board circuit and the adhesive member AD may overlap one another in the thickness direction (Z-direction), or two or more of the printed circuit board FB, the main board circuit and the adhesive member AD may overlap one another in the thickness direction (Z-direction). For example, the printed circuit board FB and the main circuit board PB may be bonded by an adhesive member AD interposed therebetween, and the lead electrode LE of the printed circuit board FB and the electrodes and/or lines of the main circuit board PB may be electrically connected to each other by the conductive particles AD_C of the adhesive member AD. It should be understood that the present disclosure is not limited thereto. The lead electrode LE of the printed circuit board FB and the electrode and/or line of the main circuit board PB may be directly bonded by ultrasonic bonding. In such case, the conductive particles AD_C may be eliminated.

Figure 3:
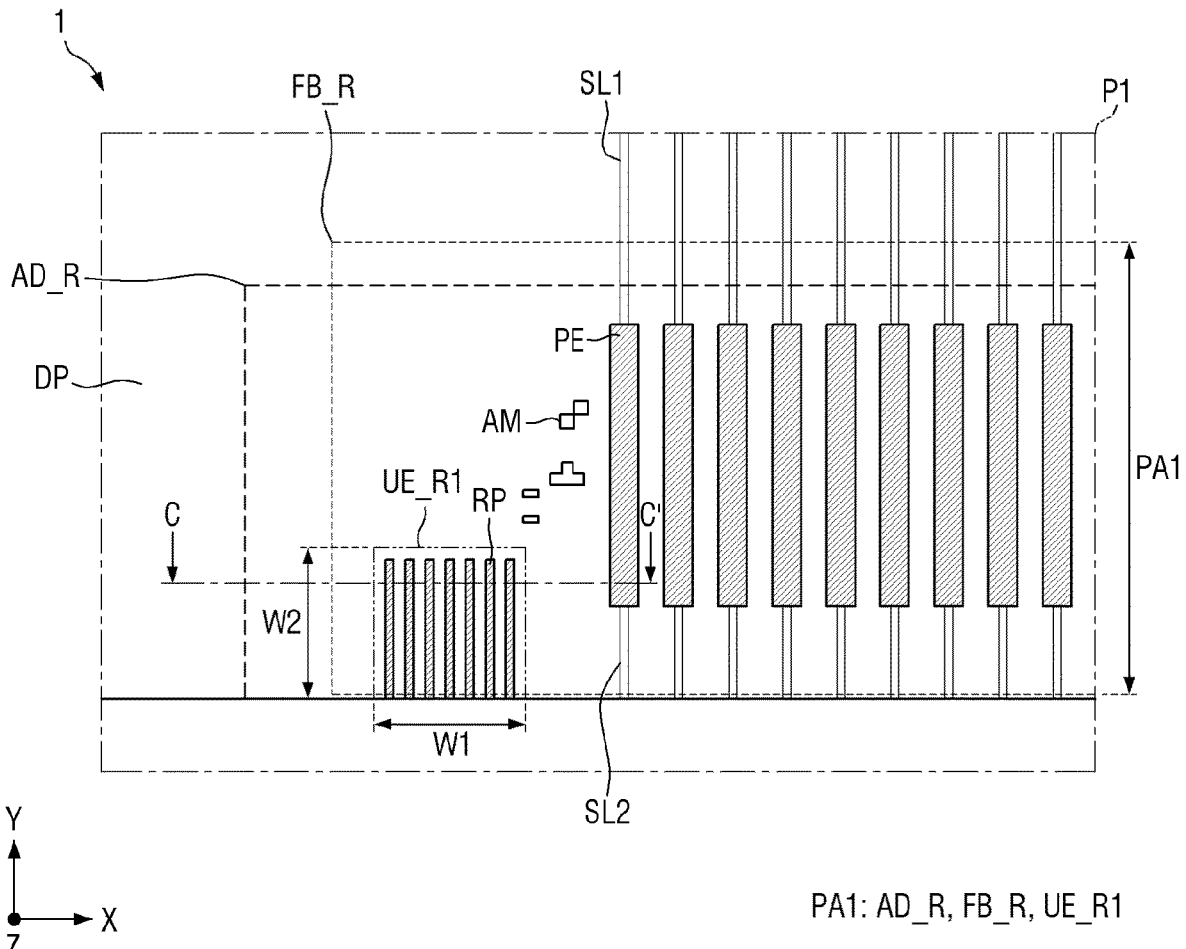
FIG. 3 is a plan view of portion P1 of FIG. 1.
Figure 4:
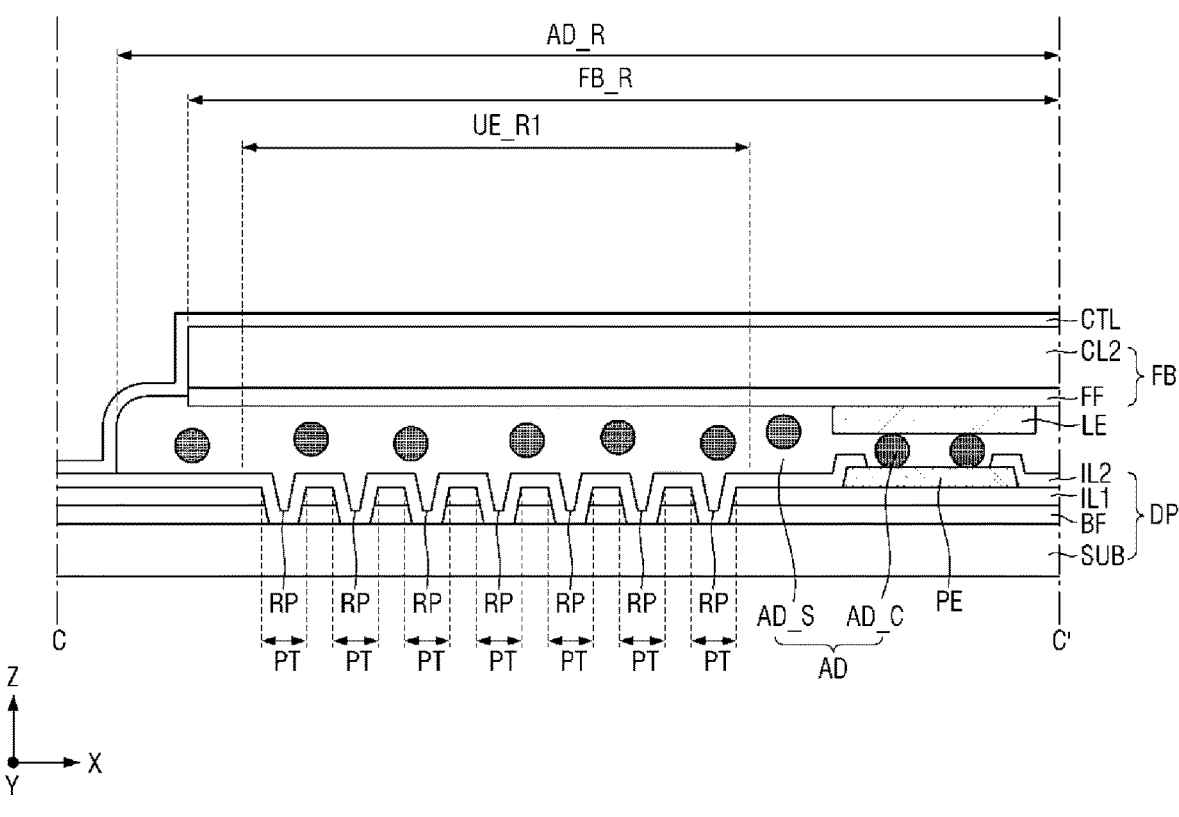
FIG. 4 is a cross-sectional view taken along line C-C' of FIG. 3.

FIG. 3 is a plan view of portion P1 of FIG. 1. FIG. 4 is a cross-sectional view taken along line C-C' of FIG. 3.

Referring to FIGS. 1, 2, and 3, the first connection area PA1 of the display panel DP may include an adhesive member attachment region AD_R where the adhesive member AD is attached, and a printed circuit board attachment region FB_R where the printed circuit board FB is attached.

For convenience of illustration, the adhesive member attachment region AD_R and the printed circuit board attachment region FB_R will be referred to as a first region AD_R and a second region FB_R, respectively.

The first region AD_R and the second region FB_R may be located in the first connection area PA1 of the non-display area NDA. In the first region AD_R, the adhesive member AD may be disposed when viewed from the top, and in the second region FB_R, the printed circuit board FB may be disposed when viewed from the top. In the first region AD_R, the display panel DP and the adhesive member AD overlap each other in the thickness direction, and in the second region FB_R, the display panel DP and the printed circuit board FB overlap each other in the thickness direction (Z-direction).

The first region AD_R and the second region FB_R may have shapes conforming to the shapes of the adhesive member AD and the printed circuit board FB, respectively, when viewed from the top. The first region AD_R and the second region FB_R may be substantially identical to the edge of the adhesive member AD and the edge of the printed circuit board FB when viewed from the top, respectively. The edge may refer to the boundary when viewed from the top.

As shown in FIG. 3, the width of the first region AD_R in the first direction X may be greater than that of the second region FB_R. The width of the second region FB_R in the second direction Y may be greater than that of the first region AD_R. Accordingly, an adhesion margin of the adhesive member AD in consideration of process errors can be obtained, and delamination of the printed circuit board FB due to bending stress or the like can be suppressed.

It is to be noted that the size (width) relationship between the first region AD_R and the second region FB_R is not limited thereto. The width of the first region AD_R in the first direction (X-direction) may be equal to or less than the second region FB_R, and the width of the second region FB_R in the second direction (Y-direction) may be equal to or less than the first region AD_R.

A plurality of pad electrodes PE may have a substantially rectangular shape elongated in the second direction (Y-direction) when viewed from the top and may be arranged in the first direction (X-direction). It is to be noted that the shape of the pad electrodes PE is not limited thereto. The plurality of pad electrodes PE may have a variety of shapes, such as a square, a circle, an ellipse, a trapezoid and a parallelogram with a long diagonal length.

The plurality of pad electrodes PE may be disposed in the first connection area PA1. The plurality of pad electrodes PE may be disposed in the area where the first region AD_R and the second region FB_R overlap each other.

The display panel DP may further include a plurality of first connection lines SL1 and a plurality of second connection lines SL2.

The first connection lines SL1 and the second connection lines SL2 may be extended in the second direction (Y-direction). The first connection lines SL1 may be connected to one side of the pad electrodes PE, for example, the upper ends of the pad electrodes PE, respectively, when viewed from the top, and the second connection lines SL2 may be connected to the other side of the pad electrodes PE, for example, the lower ends of the pad electrodes PE, respectively, when viewed from the top. The first connection lines SL1 may electrically connect the pad electrodes PE with the display area DA. The first connection lines SL1 may be electrically connected to at least one of the plurality of conductive layers BML, CDL1 and CDL2. The second connection lines SL2 may be, for example, dummy lines for testing driving of the display panel DP before and after the printed circuit board FB is attached.

As shown in FIG. 3, the ends of the second connection lines SL2 which are not connected to the pad electrodes PE may be aligned with the border of the display panel DP, but the present disclosure is not limited thereto. Although not shown in the drawings, the plurality of first connection lines SL1 may form a fan-out lines in which the distances between the first connection lines SL1 increase toward the display area DA when viewed from the top.

The display panel DP may include a plurality of alignment marks AM.

The plurality of alignment marks AM may be disposed in the first region AD_R and the second region FB_R. The plurality of alignment marks AM may be disposed such that they do not overlap with the pad electrodes PE, the first connection lines SL1 and the second connection line SL2 when viewed from the top. For example, the alignment marks AM may be located between the boundary of the first region AD_R extended in the second direction (Y-direction) and the pad electrodes PE and/or between the boundary of the second region FB_R extended in the second direction (Y-direction) and the pad electrodes PE.

The plurality of alignment marks AM may be made of a material that does not transmit light. The plurality of alignment marks AM may include a metal. The plurality of alignment marks AM may be made of the same material as the plurality of conductive layers BML, CDL1 and CDL2. Referring further to FIG. 2, the plurality of alignment marks AM may be formed simultaneously with one of the plurality of conductive layers BML, CDL1 and CDL2. For example, the plurality of alignment marks AM may be formed simultaneously with the second conductive layer CDL2, e.g., the gate electrode GE or the second conductive layer CDL2, e.g., the source electrode SE and/or the drain electrode DE. It should be understood that the present disclosure is not limited thereto.

As shown in FIG. 3, each of the plurality of alignment marks AM may have a variety of shapes, e.g., a rectangle, a square, a T-shape, etc. when viewed from the top. The plurality of alignment marks AM may have different shapes, or two or more of them may have the same shape. The plurality of alignment marks AM may have a shape different from that of each of the pad electrodes PE, the first connection lines SL1, the second connection lines SL2 and the grooves RP to be described later. The plurality of alignment marks AM may have a size smaller than that of the pad electrodes PE, but the present disclosure is not limited thereto. That is, in one example, the size of each alignment mark AM is equal to the size of each pad electrode PE, and in another example, the size of each alignment mark AM is greater than the size of each pad electrode PE.

The display panel DP may further include a first pattern region UE_R1 in which a concave-convex shape is formed.

The first pattern region UE_R1 may be disposed near the plurality of pad electrodes PE. The first pattern region UE_R1 may be disposed to at least partially overlap the first region AD_R where the adhesive member AD is attached and the second region FB_R where the printed circuit board FB is attached.

The first pattern region UE_R1 may be disposed such that it is adjacent to and/or overlaps with the border of the display panel DP, the boundary of the first region AD_R and the boundary of the second region FB_R. The border of the display panel DP may refer to the edge that is located at the portion to which the printed circuit board FB is attached and overlaps the printed circuit board FB. According to an embodiment of the present disclosure, the first pattern region UE_R1 may be disposed such that it is adjacent to and/or overlaps with the boundary of the first region AD_R or the boundary of the second region FB_R whichever is adjacent to the border of the display panel DP.

For example, as shown in FIG. 3, the first pattern region UE_R1 may overlap the boundary of the first region AD_R that is extended in the first direction (X-direction) and is adjacent to the ED of the display panel DP, and may be aligned with the boundary of the second region FB_R that is extended in the first direction (X-direction) and is aligned with the edge of the display panel DP. It should be understood that the present disclosure is not limited thereto.

At the border of the display panel DP, the boundary of the first region AD_R and the boundary of the second region FB_R, the printed circuit board FB may be delaminated. As the first pattern region UE_R1 is disposed at the border of the display panel DP, the boundary of the first region AD_R and the boundary of the second region FB_R, it is possible to suppress the delamination of the printed circuit board FB.

The first pattern region UE_R1 may be disposed to overlap at least one of the first region AD_R and the second region FB_R when viewed from the top. According to an embodiment of the present disclosure, the first pattern region UE_R1 may be disposed mainly in the first region AD_R and the second region FB_R, and may be disposed on the outer side of the first region AD_R so that some portions of the first pattern region UE_R1 do not overlap the first region AD_R. It should be understood that the present disclosure is not limited thereto. The first pattern region UE_R1 may be disposed where the first region AD_R and the second region FB_R overlap each other.

Specifically, the first region AD_R may be spaced apart from the edge of the display panel DP toward the inside of the display panel DP when viewed from the top. The edge of the first region AD_R that is adjacent to the edge of the display panel DP and extended in the first direction (X-direction) may be spaced apart from the edge of the display panel DP that is extended in the first direction (X-direction). That is, the adhesive member AD may be disposed to be spaced apart from the edge of the display panel DP in the first direction (X-direction) when viewed from the top. Accordingly, it is possible to have an adhesion margin for the adhesive member AD in consideration of a process error. It should be understood that the present disclosure is not limited thereto. The first region AD_R may be aligned with the edge of the display panel DP.

The second region FB_R may be aligned with the border of the display panel DP. That is, a part of the printed circuit board FB may be disposed on the display panel DP.

According to an embodiment of the present disclosure, the edge of the first pattern region UE_R1 may be aligned with the border of the display panel DP when viewed from the top. In such case, the first pattern region UE_R1 may overlap with the boundary of the first region AD_R. Specifically, the first pattern region UE_R1 may overlap one of the longer sides of the boundary of the first region AD_R extended in the first direction (X-direction) which is adjacent to the border of the display panel DP. A part of the first pattern region UE_R1 that is located more to the outside than the first region AD_R may overlap only the second region FB_R while a part thereof located more to the inside may overlap the first region AD_R and the second region FB_R. That is, the first pattern region UE_R1 may overlap only the second region FB_R disposed between the border of the display panel DP and the edge of the first region AD_R spaced apart from it. It should be understood that the present disclosure is not limited thereto.

According to an embodiment of the present disclosure, the first pattern region UE_R1 may have a generally square shape when viewed from the top. For example, the first pattern region UE_R1 may have a square shape when viewed from the top, which has a first width W1 in the first direction (X-direction) of approximately 1 mm and a second width W2 in the second direction (Y-direction) of approximately 1 mm. It should be understood that the present disclosure is not limited thereto. The first pattern region UE_R1 may have a variety of shapes such as a rectangle, a diamond, a trapezoid, a triangle, a circle, an oval, and a polygon.

The first pattern region UE_R1 may be disposed so that it does not overlap the pad electrodes PE, a first line, a second line, and the alignment marks AM when viewed from the top. According to an embodiment of the present disclosure, the plurality of pad electrodes PE may be arranged in the first direction (X-direction) from the pad electrode PE located at the outermost position, and may be spaced apart from the pad electrode PE located at the outermost position in the opposite direction to the first direction (X-direction). For example, as shown in FIG. 3, the first pattern region UE_R1, the plurality of alignment marks AM and the plurality of pad electrodes PE may be arranged sequentially from the edge of the first region AD_R that is extended in the second direction (Y-direction). In such case, the first pattern region UE_R1 may partially overlap the alignment marks AM in the second direction (Y-direction) when viewed from the top. It should be understood that the present disclosure is not limited thereto. The first pattern region UE_R1 may not overlap the alignment mark AM in the second direction (Y-direction) when viewed from the top.

The first pattern region UE_R1 may be disposed more distant from the pad electrodes PE than the alignment marks AM are. That is, the alignment marks AM are disposed between the first pattern region UE_R1 and the pad electrodes PE. The distance between the first pattern region UE_R1 and the pad electrodes PE in the first direction (X-direction) may be greater than or equal to the distance between the plurality of alignment marks AM and the pad electrode PE in the first direction (X-direction). The pad electrode PE may be the pad electrode PE that is located at the outermost position among the plurality of pad electrodes PE. The distances may be measured from the portions (edges) of the first pattern region UE_R1 and/or the alignment marks AM which are closest to the pad electrodes PE. It should be understood that the present disclosure is not limited thereto. The distances may refer to average distances.

The first pattern region UE_R1 may include a plurality of grooves RP.

The plurality of grooves RP may be formed in the first pattern region UE_R1. Each of the grooves RP may have a rectangular shape elongated in the second direction Y when viewed from the top. The plurality of grooves RP may be extended in the second direction (Y-direction) and may form a stripe pattern arranged in the first direction (X-direction). The second direction (Y-direction) may cross or perpendicular to the border of the display panel DP and the longer side of the first region AD_R parallel to it (the longer side of the second region FB_R). When a certain force is applied to the printed circuit board FB and accordingly it is bent in the thickness direction, the force is dispersed over a larger adhesion area, to prevent delamination of the printed circuit board FB.

The plurality of grooves RP (the first pattern region UE_R1) may overlap with the base resin AD_S in the thickness direction. At least some of the plurality of grooves RP may overlap the conductive particles AD_C in the thickness direction.

The grooves RP may have a shape different from that of the alignment marks AM when viewed from the top. Accordingly, the alignment marks AM can be more easily identified.

When viewed from the top, one ends of the grooves RP may be located where the first region AD_R and the second region FB_R overlap each other, while the opposite ends of the grooves RP may be aligned with the border of the display panel DP. It should be understood that the present disclosure is not limited thereto. The opposite ends of the grooves RP may be spaced apart from the border of the display panel DP. It should be noted that the extending direction and/or shape of the grooves RP are not limited thereto. The grooves RP may be extended in the second direction (Y-direction) or a diagonal direction, or may have a variety of shapes such as a square, a triangle, a polygon, a circle and an oval as long as they can improve the adhesive force of the adhesive member AD.

The plurality of grooves RP may overlap at least partially the first region AD_R and the second region FB_R when viewed from the top. According to an embodiment of the present disclosure, some of the grooves RP may be located where the first region AD_R and the second region FB_R overlap each other when viewed from the top, and some others of the grooves RP may be located between the boundary of the first region AD_R and the border of the display panel DP and overlap only the second region FB_R. It should be understood that the present disclosure is not limited thereto. All of the grooves RP may be located where the first region AD_R and the second region FB_R overlap each other.

The grooves RP may be disposed such that they are adjacent to and/or overlap with at least one of the border of the display panel DP, the boundary of the first region AD_R and the boundary of the second region FB_R. According to an embodiment of the present disclosure, the opposite ends of the grooves RP may be aligned with the border of the display panel DP and/or the boundary of the second region FB_R, and but may overlap the boundary of the first region AD_R so that it crosses the first region AD_R. It should be understood that the present disclosure is not limited thereto.

Referring to FIGS. 3 and 4, as described above, the length of the first region AD_R in the first direction (X-direction) may be greater than that of the second region FB_R. Accordingly, the edge of the adhesive member AD and a nearby area may not overlap the printed circuit board FB, but may be exposed in the first direction (X-direction) and/or the thickness direction (Z-direction).

The display device 1 may include a plurality of penetration holes PT passing through at least one insulating layer disposed in the first pattern region UE_R1. According to an embodiment of the present disclosure, the plurality of penetration holes PT may pass through the buffer layer BF and the first insulating layer IL1 in the thickness direction (Z-direction). It should be understood that the present disclosure is not limited thereto. The plurality of penetration holes PT may penetrate only the first insulating layer ILE According to an embodiment of the present disclosure, the penetration holes PT may have a tapered shape that becomes narrower toward the substrate, but the present disclosure is not limited thereto. In another example, the width of the penetration holes PT may be constant or may increase toward the substrate.

The plurality of penetration holes PT may be located at substantially the same positions as the plurality of grooves RP in the first pattern region UE_R1, respectively. The plurality of penetration holes PT may overlap the plurality of grooves RP in the thickness direction (Z-direction), respectively. Although not shown in the drawings, the plurality of penetration holes PT may have a shape that is substantially the same as or similar to that of the plurality of grooves RP.

The second insulating layer IL2 may be disposed to cover the upper surface of the first insulating layer IL1 facing the printed circuit board FB and the plurality of penetration holes PT.

The plurality of grooves RP may be formed on the upper surface of the second insulating layer IL2 overlapping the printed circuit board FB and the adhesive member AD. Specifically, on the upper surface of the second insulating layer IL2 facing the printed circuit board FB, the plurality of grooves RP may be formed, which has a tapered shape conforming to the surface shape of the portion in which the plurality of penetration holes PT is formed and the surface shape of the element disposed under the layer where the penetration holes PT are formed, e.g., the substrate, e.g., the cross-sectional shape with level differences or convex-concave shape. Although not shown in the drawings, the via layer VIA may be further disposed on the second insulating layer IL2, as described above.

The plurality of penetration holes PT and the plurality of grooves RP may have a fine size of several micrometers to several hundred micrometers. For example, the width of the grooves RP in the first direction (X-direction) may range approximately from 1 μm to 500 μm. In such case, the length of the grooves RP in the second direction (Y-direction) may be substantially equal to the second width W2 of the first pattern region UE_R1. The width of the plurality of penetration holes PT and the plurality of grooves RP in the first direction (X-direction) may be smaller than the width of the portion where the pad electrodes PE are exposed in the first direction (X-direction). The width of the plurality of penetration holes PT and the plurality of grooves RP in the first direction (X-direction) may be smaller than the diameter of the conductive particles AD_C. It should be noted that the number of the plurality of grooves RP and the size or length of each of the grooves RP are not limited to the above example, and may be altered in a variety of ways depending on the design of the display device 1.

The plurality of penetration holes PT and the plurality of grooves RP may have minute depths. Accordingly, it is possible to prevent the issue of a residual film, which may occur when another layer, e.g., the via layer VIA or the pixel-defining layer PDL made of an organic material is formed. For example, the depth of the plurality of penetration holes PT and/or the plurality of grooves RP may be approximately 1 μm or less, but the present disclosure is not limited thereto.

As described above, the adhesive member AD may be interposed between the display panel DP and the printed circuit board FB. One portion of the base resin AD_S may be disposed between the plurality of grooves RP (the plurality of penetration holes PT) and the base film FF, and the other portion of the base resin AD_S may be disposed between the lead electrode LE and the pad electrode PE. The plurality of grooves RP may be filled with the base resin AD_S. As the contact area of the base resin AD_S increase by the shape of the plurality of grooves RP, the adhesive force of the adhesive member AD can increase.

The display device 1 may further include an anti-moisture layer CTL disposed across the display panel DP and the printed circuit board FB. It should be understood that the present disclosure is not limited thereto. The anti-moisture layer CTL may be eliminated.

The anti-moisture layer CTL may be disposed across the top layer (the outermost layer) of the display panel DP and the top layer (the outermost layer) of the printed circuit board FB. According to an embodiment of the present disclosure, the anti-moisture layer CTL may cover the upper surface of the second insulating layer IL2 forming the upper surface of the display panel DP in the first connection area PA1, and the upper surface of the second coating layer CL2 forming the upper surface of the printed circuit board FB. In this instance, the side surface and a part of the upper surface of the adhesive member AD exposed between the printed circuit board FB and the display panel DP may also be covered by the anti-moisture layer CTL, as shown on the left hand of FIG. 4. The anti-moisture layer CTL can prevent external moisture from permeating into the first connection area PA1, e.g., the plurality of grooves RP. Although not shown in the drawings, the anti-moisture layer CTL may be further disposed on the lower surface of the display panel DP (the lower surface of the substrate) and the lower surface of the printed circuit board FB. Furthermore, the anti-moisture layer CTL may be further disposed on the side surfaces of the display panel DP and the printed circuit board FB to completely surround the display panel DP and the printed circuit board FB.

Referring to FIGS. 1, 2, 3, and 4, the right part of the first connection area PA1 in the plan view of FIG. 1 may have the structure that is substantially identical to or similar to the structure of the left part P1 of the first connection area PA1 shown in FIGS. 3 and 4. For example, a plurality of pad electrodes PE, a plurality of alignment marks AM, a plurality of grooves RP and a plurality of penetration holes PT may be disposed in the right part of the first connection area PA1 as well. In such case, the arrangement and positional relationship of the plurality of pad electrodes PE, the plurality of alignment marks AM, the plurality of grooves RP and the plurality of penetration holes PT may be substantially identical to or similar to the left part of the first connection area PA1. The right part of the first connection area PA1 may have a symmetrical structure with respect to the center of the first connection area PA1, but the present disclosure is not limited thereto.

In some embodiments, although not shown in the drawings, an adhesive member AD may be interposed between the driving member DDM and the printed circuit board FB of the display device 1 for bonding them. A pattern region in a shape that is substantially the same as or similar to the first pattern region UE_R1 may be formed where the adhesive member AD is attached in order to enhance the adhesive force.

Figure 5:
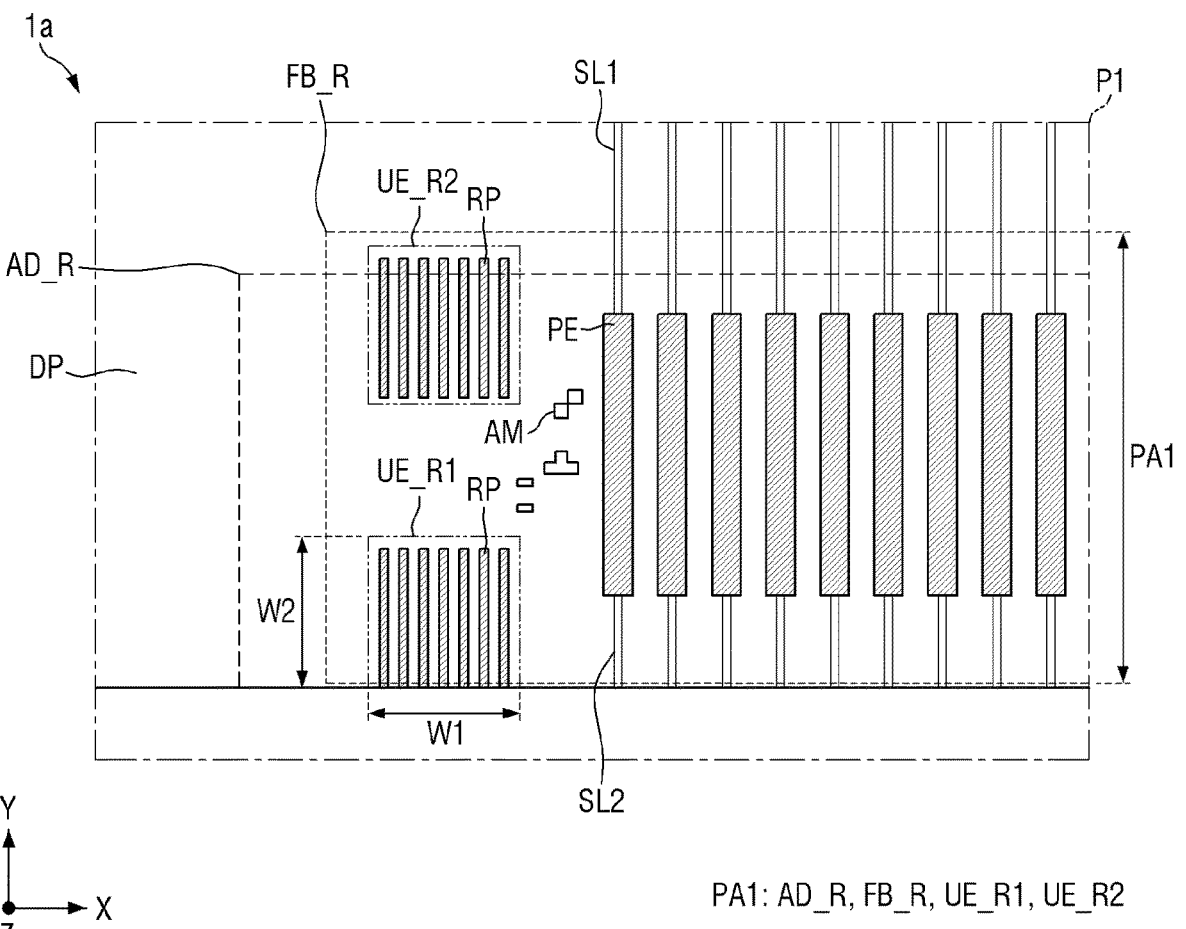
FIG. 5 is a plan view of a display device according to another embodiment of the present disclosure.

FIG. 5 is a plan view of a display device according to another embodiment of the present disclosure.

The display device 1 according to the embodiment of FIG. 5 is different from the embodiment of FIGS. 1, 2, 3, and 4 in that a first connection area PA1 includes a plurality of pattern areas UE_R1 and UE_R2.

Referring to FIG. 5, the first connection area PA1 may further include a second pattern area UE_R2. In other words, a plurality of pattern regions for enhancing the adhesive force of the adhesive member AD may be formed.

The second pattern region UE_R2 may be disposed such that it is adjacent to and/or overlaps the longer side of the first region AD_R and the longer side of the second region FB_R that are spaced apart from the border of the display panel DP. Accordingly, the adhesive force at the edge of the printed circuit board FB can be improved, so that delamination of the printed circuit board FB can be suppressed. For example, the second pattern region UE_R2 may be mainly disposed where the first region AD_R and the second region FB_R overlap each other when viewed from the top, and may be disposed to overlap the longer side of the first region AD_R located in the second region FB_R. It should be understood that the present disclosure is not limited thereto.

The second pattern region UE_R2 may be disposed so that it does not overlap the plurality of alignment marks AM and the plurality of pad electrodes PE when viewed from the top. The positional relationships between the second pattern region UE_R2, the plurality of alignment marks AM and the plurality of pad electrodes PE when viewed from the top may be substantially the same as or similar to that of the first pattern region UE_R1. According to an embodiment of the present disclosure, the distance between the second pattern region UE_R2 and the pad electrodes PE in the first direction (X-direction) may be substantially equal to the distance between the first pattern region UE_R1 and the pad electrodes PE. The distance between the second pattern region UE_R2 and the pad electrodes PE in the first direction (X-direction) may be greater than the distance between the plurality of alignment marks AM and the pad electrodes PE in the first direction (X-direction).

The second pattern region UE_R2 may have a structure substantially the same as or similar to that of the first pattern region UE_R1. The second pattern region UE_R2 may include a plurality of grooves RP which are the same as or similar to those of the first pattern region UE_R1. The shape of the plurality of grooves RP in the second pattern region UE_R2 may be identical to that of the plurality of grooves RP in the first pattern region UE_R1, but the present disclosure is not limited thereto. Although not shown in the drawings, a plurality of penetration holes PT as shown in FIG. 4 may be formed under the plurality of grooves RP disposed in the second pattern region UE_R2.

The embodiment of FIG. 5 is substantially identical to or similar to the embodiment of FIGS. 1, 2, 3, and 4 except that the first connection area PA1 includes the plurality of pattern areas UE_R1 and UE_R2 and, therefore, the redundant descriptions will be omitted.

Figure 6:
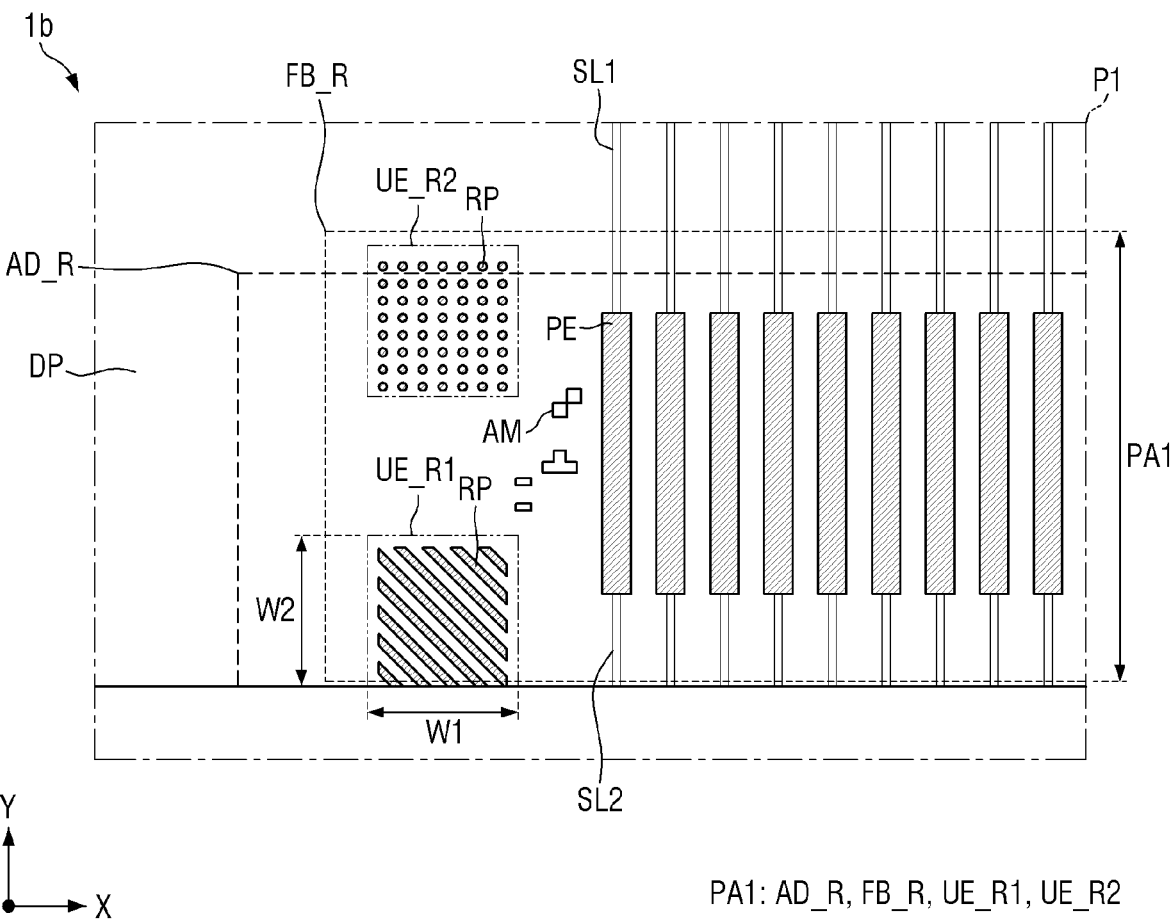
FIG. 6 is a plan view of a display device according to yet another embodiment of the present disclosure.

FIG. 6 is a plan view of a display device according to yet another embodiment of the present disclosure.

A display device 1b according to the embodiment of FIG. 6 is different from the display device according to the embodiment of FIGS. 1, 2, 3, and 4 in that a plurality of grooves RP have different shapes.

Referring to FIG. 6, the plurality of grooves RP may have a variety of shapes other than the stripe shape.

The shape of the plurality of grooves RP in the first pattern region UE_R1 may be different from the shape of the plurality of grooves RP in the second pattern region UE_R2. Accordingly, the adhesion area of the adhesive member AD of the first pattern region UE_R1 and the second pattern region UE_R2 may also vary. It should be understood that the present disclosure is not limited thereto. The shapes of the plurality of grooves RP in the first pattern region UE_R1 and the second pattern region UE_R2 may be the same. In the example shown in FIG. 6, two pattern regions are illustrated. It should be noted that even when only the first pattern region UE_R1 is formed, grooves RP in various shapes may be applied, such as the shapes of the plurality of grooves RP shown in FIG. 6.

For example, as shown on the lower hand of FIG. 6, the plurality of grooves RP formed in the first pattern region UE_R1 may be extended in a diagonal direction crossing the first direction (X-direction) and the second direction (Y-direction) when viewed from the top. In such case, at least some of the plurality of grooves RP may have different lengths. As another example, the plurality of grooves RP formed in the second pattern region UE_R2 may have a circular shape or a dot shape when viewed from the top.

That is to say, the shapes of the plurality of grooves RP may vary depending on the design of the display device 1, and any shape may be applied as long as the contact area of the base resin AD_S of the adhesive member AD can increase.

The embodiment of FIG. 6 is substantially identical to or similar to the embodiment of FIG. 5 except for the shapes of the plurality of grooves RP; and, therefore, the redundant descriptions will be omitted.

Figure 7:
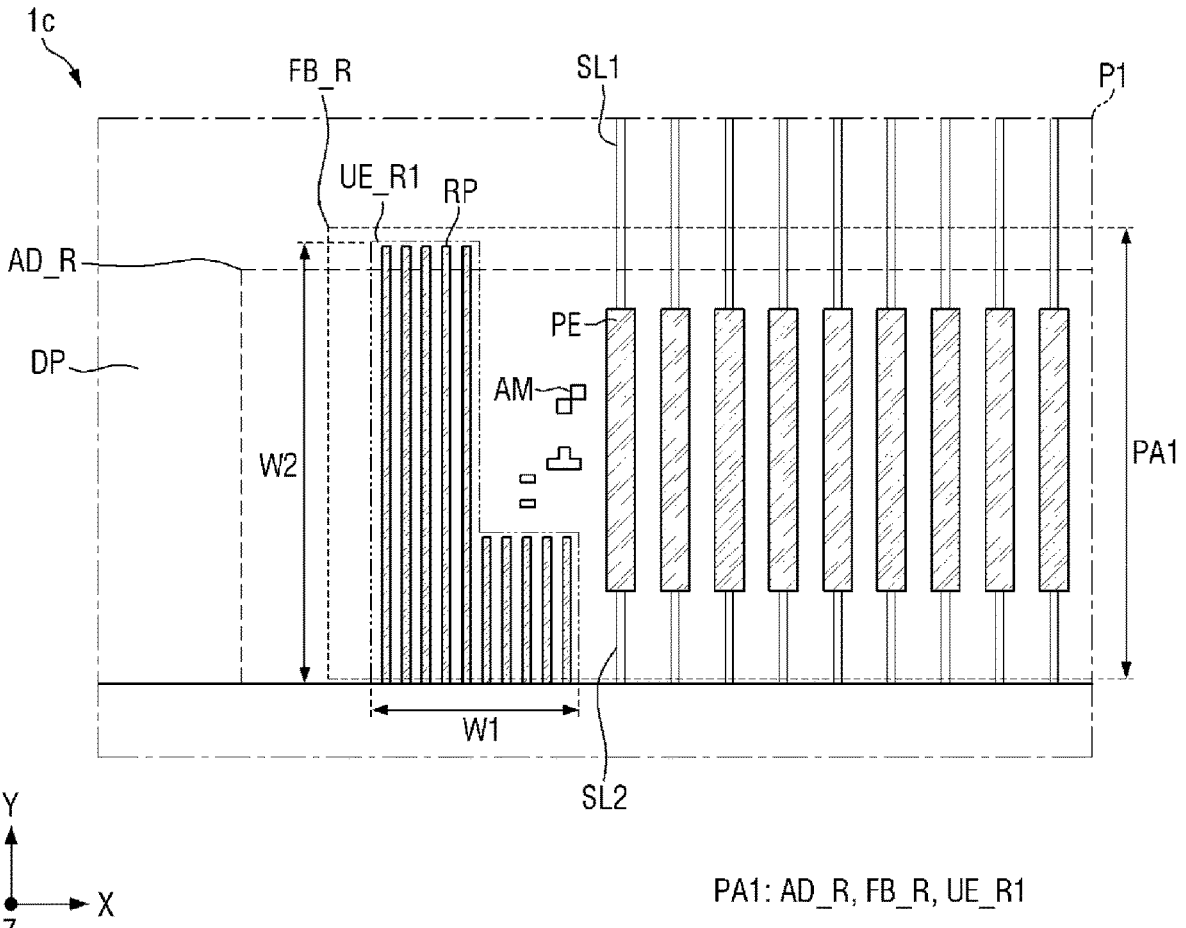
FIG. 7 is a plan view of a display device according to yet another embodiment of the present disclosure.

FIG. 7 is a plan view of a display device according to yet another embodiment of the present disclosure.

A display device 1c according to the embodiment of FIG. 7 is different from the display device according to the embodiment of FIGS. 1, 2, 3, and 4 in that grooves RP have different lengths.

Referring to FIG. 7, as described above, the plurality of grooves RP may be formed in the first pattern region UE_R1. In this instance, the first pattern region UE_R1 may be disposed across the both longer sides of the first region AD_R extended in the first direction (X-direction), unlike that shown in FIG. 3.

The both ends of the grooves RP may be disposed between the upper longer side of the first region AD_R and the upper longer side of the second region FB_R spaced apart from the border of the display panel DP. That is, the second width W2 of the first pattern region UE_R1 (the length of the plurality of grooves RP in the second direction (Y-direction)) may be greater than the width of the adhesive member AD in the second direction (Y-direction). As the first pattern region UE_R1 (the plurality of grooves RP) is disposed along the edges of the first region AD_R and the second region FB_R extended in the second direction (Y-direction), the adhesive force of the portion can increase. It should be understood that the present disclosure is not limited thereto. The both ends of the plurality of grooves RP may be aligned with both longer sides of the first region AD_R, respectively, when viewed from the top.

For example, as shown in FIG. 7, one ends of the plurality of grooves RP may be located between the border of the display panel DP and the lower longer side of the first region AD_R, and the other ends of the plurality of grooves RP may be located between the upper longer side of the first region AD_R and the upper longer side of the second region FB_R. The one ends of the plurality of grooves RP may be aligned with the border of the display panel DP, but the present disclosure is not limited thereto.

The grooves portions RP may have different lengths. The length of some of the grooves RP in the second direction (Y-direction) may be greater than or equal to the length of the first region AD_R in the second direction (Y-direction).

The length of some of the grooves RP in the second direction (Y-direction) may be less than or equal to the length of the second region AD_R in the second direction (Y-direction). The length of some others of the grooves RP in the second direction (Y-direction) may be less than or equal to the length of the first region AD_R in the second direction (Y-direction).

The plurality of alignment marks AM may be disposed between the plurality of pad electrodes PE and the plurality of grooves RP. As shown in FIG. 7, the first pattern region UE_R1 (the plurality of grooves RP) may be disposed to surround the plurality of alignment marks AM at least partially when viewed from the top. For example, the first pattern region UE_R1 may surround the plurality of alignment marks AM and/or the lower and left sides of the region in which the alignment marks AM are disposed when viewed from the top. It should be understood that the present disclosure is not limited thereto.

The embodiment of FIG. 7 is substantially identical to or similar to the embodiment of FIGS. 1, 2, 3, and 4 except the lengths of the plurality of grooves RP and, therefore, the redundant descriptions will be omitted.

Figure 8:
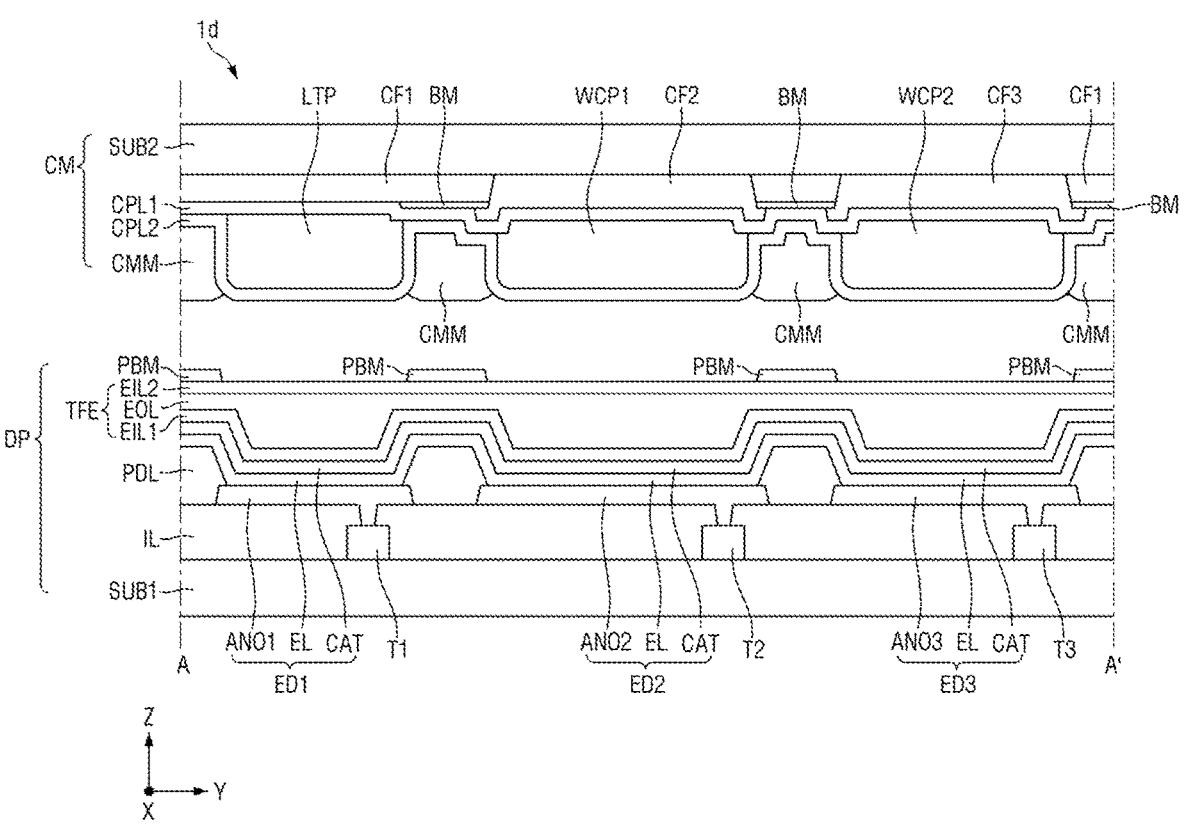
FIG. 8 is a cross-sectional view of a display device according to yet another embodiment of the present disclosure.

FIG. 8 is a cross-sectional view of a display device according to yet another embodiment of the present disclosure.

A display device 1d according to the embodiment of FIG. 8 is mainly different from the embodiment of FIGS. 1, 2, 3, and 4 in that a quantum-dot display structure is applied.

Referring to FIG. 8, the display device 1d may include a first substrate SUB1, a plurality of switching elements T1, T2 and T3, an insulating layer IL, a plurality of anode electrodes ANO1, ANO2 and ANO3, a pixel-defining layer PDL, an emissive layer EL, a cathode electrode CAT, a thin-film encapsulation layer TFE, and a panel light-blocking member PBM.

In FIG. 8, the structure stacked between the thin-film encapsulation layer TFE and the first substrate SUB1 is schematically depicted as a plurality of switching elements T1, T2, and T3 and an insulating layer IL.

As described above, the first substrate SUB1 may be a rigid substrate or a flexible substrate.

The plurality of switching elements T1, T2, and T3 may be disposed on the first substrate SUB1. For example, each of the plurality of switching elements T1, T2 and T3 may be, but is not limited to, a thin-film transistor TR including the semiconductor layer ACT, the gate electrode GE, the source electrode SE and the drain electrode DE of FIG. 2.

The insulating layer IL may include a plurality of layers made of an organic insulating material or an inorganic insulating material. The insulating layer IL may include, but is not limited to, the first insulating layer IL1 to the second insulating layer IL2 and the via layer VIA of FIG. 2.

The plurality of anode electrodes ANO1, ANO2, and ANO3 may be disposed on the insulating layer IL. The plurality of anode electrodes ANO1, ANO2, and ANO3 may pass through the insulating layer IL to be connected to the plurality of switching elements T1, T2, and T3, respectively. The plurality of anode electrodes ANO1, ANO2, and ANO3 may have different areas but the present disclosure is not limited thereto. The plurality of anode electrodes ANO1, ANO2, and ANO3 may include a first anode electrode ANO1, a second anode electrode ANO2, and a third anode electrode ANO3 disposed in different regions. That is, the first anode electrode ANO1 is electrically connected to the first switching element T1, the second anode electrode ANO2 is electrically connected to the second switching element T2, and the third anode electrode ANO3 is electrically connected to the third switching element T3.

The pixel-defining layer PDL may be disposed on the insulating layer IL. The pixel-defining layer PDL may be disposed between the plurality of anode electrodes ANO1, ANO2, and ANO3. The pixel-defining layer PDL may cover the ends of each of the anode electrodes ANO.

The emissive layer EL may be disposed on the plurality of anode electrodes ANO1, ANO2, and ANO3. Unlike the embodiment of FIG. 2, the emissive layer EL may have a continuous film shape disposed across the plurality of anode electrodes ANO1, ANO2, and ANO3 and the pixel-defining layer PDL, but the present disclosure is not limited thereto.

The cathode electrode CAT may be disposed on the emissive layer EL. The cathode electrode CAT may have a shape of a continuous film disposed over the plurality of anode electrodes ANO1, ANO2, and ANO3, and the pixel-defining layer PDL, similar to the emissive layer EL.

The first anode electrode ANO1, the emissive layer EL, and the cathode electrode CAT may form the first light-emitting diode ED1. The second anode electrode ANO2, the emissive layer EL, and the cathode electrode CAT may form the second light-emitting diode ED2. The third anode electrode ANO3, the emissive layer EL, and the cathode electrode CAT may form the third light-emitting diode ED3. The first light-emitting diode ED1, the second light-emitting diode ED2, and the third light-emitting diode ED3 emit light, and the light may be provided to a light transmission pattern LTP, a first wavelength conversion pattern WCP1, and a second wavelength conversion pattern WCP2, which will be described later.

The thin-film encapsulation layer TFE may be disposed on the cathode electrode CAT. The configuration of the thin-film encapsulation layer TFE has been described in detail above with reference to FIG. 2.

A panel light blocking member PBM may be disposed on the thin-film encapsulation layer TFE. The panel light blocking member PBM may include a light-blocking material. The panel light blocking member PBM can prevent color mixing to improve color gamut. The panel light blocking member PBM may be eliminated.

The display device 1d may further include a color conversion member CM disposed to face the display panel DP.

The color conversion member CM may be disposed to overlap the display panel DP. The color conversion member CM may be disposed on the upper surface (front surface) of the display panel DP where light exits. A filler may be disposed or an air gap may be formed between the display panel DP and the color conversion member CM.

The color conversion member CM may include a second substrate SUB2, a plurality of color filters CF1, CF2 and CF3, a light-blocking member BM, a first capping layer CPL1, a light transmission pattern LTP, a first wavelength conversion pattern WCP1, a second wavelength conversion pattern WCP2, a second capping layer CPL2, and an anti-color mixing member CMM, which are stacked on one another sequentially toward the display panel DP.

The second substrate SUB2 may be a rigid substrate or a flexible substrate. The second substrate SUB2 may be made of the same or similar material with the first substrate SUB1, but the present disclosure is not limited thereto.

The plurality of color filters CF1, CF2, and CF3 may be disposed in different regions on the second substrate SUB2. The plurality of color filters CF1, CF2, and CF3 may include a first color filter CF1, a second color filter CF2, and a third color filter CF3 overlapping the first light-emitting diode ED1 (the first anode electrode ANO1), the second light-emitting diode ED2 (the second anode electrode ANO2), and the third light-emitting diode ED3 (the third anode electrode ANO3) in the thickness direction (Z-direction), respectively.

According to an embodiment of the present disclosure, the display panel DP may emit light of a first color to the color conversion member CM. In this instance, the first color filter CF1 may selectively transmit the light of the first color and block or absorb the light of a second color and the light of a third color. The second color filter CF2 may transmit light of the second color and block or absorb light of the first color and light of the third color. The third color filter CF3 may transmit light of the third color and block or absorb light of the first color and light of the second color. The first color, the second color and the third color may be, but are not limited to, blue, red, and green, respectively.

As shown in FIG. 8, a part of the first color filter CF1 may be further extended in the horizontal direction (Y-direction) or may be disposed between the second color filter CF2 and the third color filter CF3 to overlap the pixel-defining layer PDL and the light-blocking member BM in the thickness direction (Z-direction). In this manner, it is possible to reduce the reflection of external light. It should be noted that the arrangement of the first color filter CF1 is not limited thereto.

The light-blocking member BM may be disposed on the plurality of color filters CF1, CF2, and CF3. The light-blocking member BM may be disposed to overlap the pixel-defining layer PDL in the thickness direction (Z-direction). The light-blocking member BM may include a light-blocking material to block transmission of light passing therethrough. It should be understood that the present disclosure is not limited thereto. The light-blocking member BM may be eliminated.

The first capping layer CPL1 may be disposed on the plurality of color filters CF1, CF2, and CF3 and the light-blocking member BM. The first capping layer CPL1 can block external moisture or air. For example, the first capping layer CPL1 may be made of, but is not limited to, a material including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

The light transmission pattern LTP, the first wavelength conversion pattern WCP1 and the second wavelength conversion pattern WCP2 may be disposed on the first capping layer CPL1. The light transmission pattern LTP, the first wavelength conversion pattern WCP1 and the second wavelength conversion pattern WCP2 may be disposed to overlap the first light-emitting diode ED1, the second light-emitting diode ED2, and the light-emitting diode ED3, respectively.

The light transmission pattern LTP may transmit incident light, e.g., light of the first color. The first wavelength conversion pattern WCP1 and the second wavelength conversion pattern WCP2 may include wavelength shifters such as quantum dots, quantum bars and phosphors, and may convert or shift the peak wavelength of incident light into light of another peak wavelength to output it. For example, the first wavelength conversion pattern WCP1 may convert the incident light of the first color into light of the second color to output it, and the second wavelength conversion pattern WCP2 may convert the incident light of the first color into light of the third color to output it.

The second capping layer CPL2 may be disposed on the light transmission pattern LTP, the first wavelength conversion pattern WCP1, and the second wavelength conversion pattern WCP2. The second capping layer CPL2 may be made of, but is not limited to, a material substantially the same as or similar to that of the first capping layer CPL1.

The light transmission pattern LTP, the first wavelength conversion pattern WCP1, and the second wavelength conversion pattern WCP2 may be interposed between the first capping layer CPL1 and the second capping layer CPL2. The light transmission pattern LTP, the first wavelength conversion pattern WCP1 and the second wavelength conversion pattern WCP2 may be spaced apart from one another in cross section, and the first capping layer CPL1 and the second capping layer CPL2 may be in direct contact with each other.

The anti-color mixing member CMM may be disposed on the second capping layer CPL2. The anti-color mixing member CMM may include a light-blocking material. The anti-color mixing member CMM may be disposed to overlap the pixel-defining layer PDL, the panel light blocking member PBM and the light-blocking member BM in the thickness direction. The anti-color mixing member CMM may be disposed between the light transmission pattern LTP and the first wavelength conversion pattern WCP1, between the first wavelength conversion pattern WCP1 and the second wavelength conversion pattern WCP2, and between the second wavelength conversion pattern WCP2 and the light transmission pattern LTP to prevent color mixing.

The embodiment of FIG. 8 is substantially identical to or similar to the embodiment of FIGS. 1, 2, 3, and 4 except the color convert member and, therefore, the redundant descriptions will be omitted.

Figure 9:
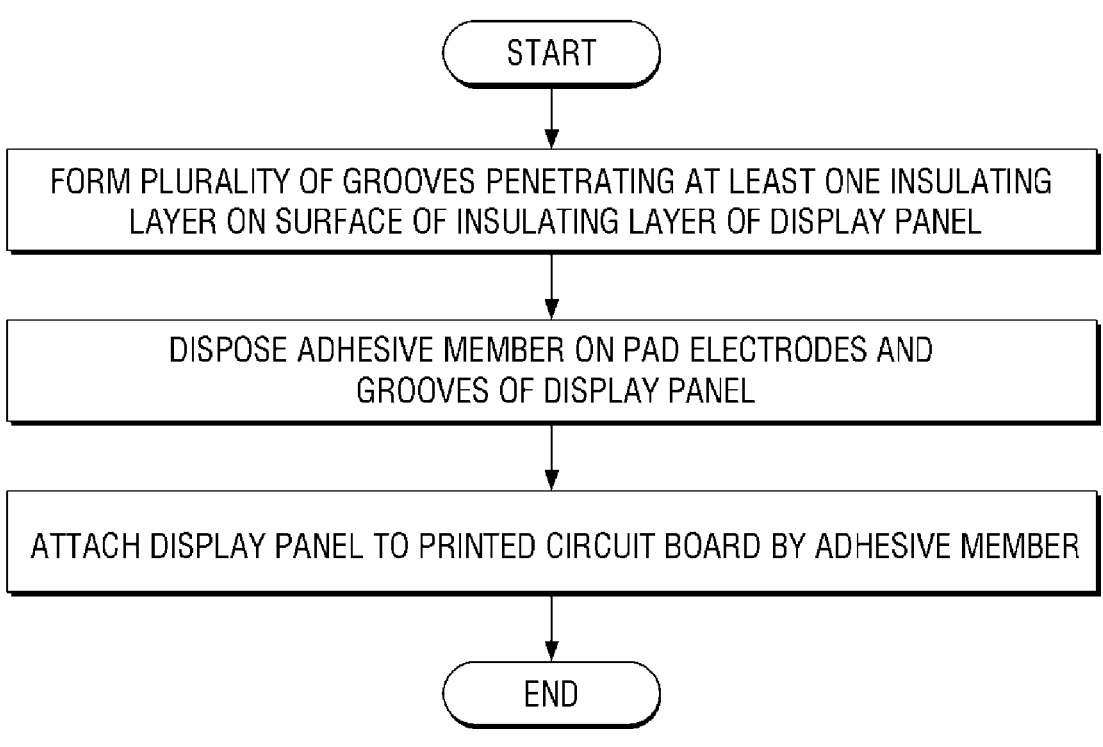
FIG. 9 is a flowchart for illustrating a method for fabricating a display device according to an embodiment of the present disclosure.
Figure 10:
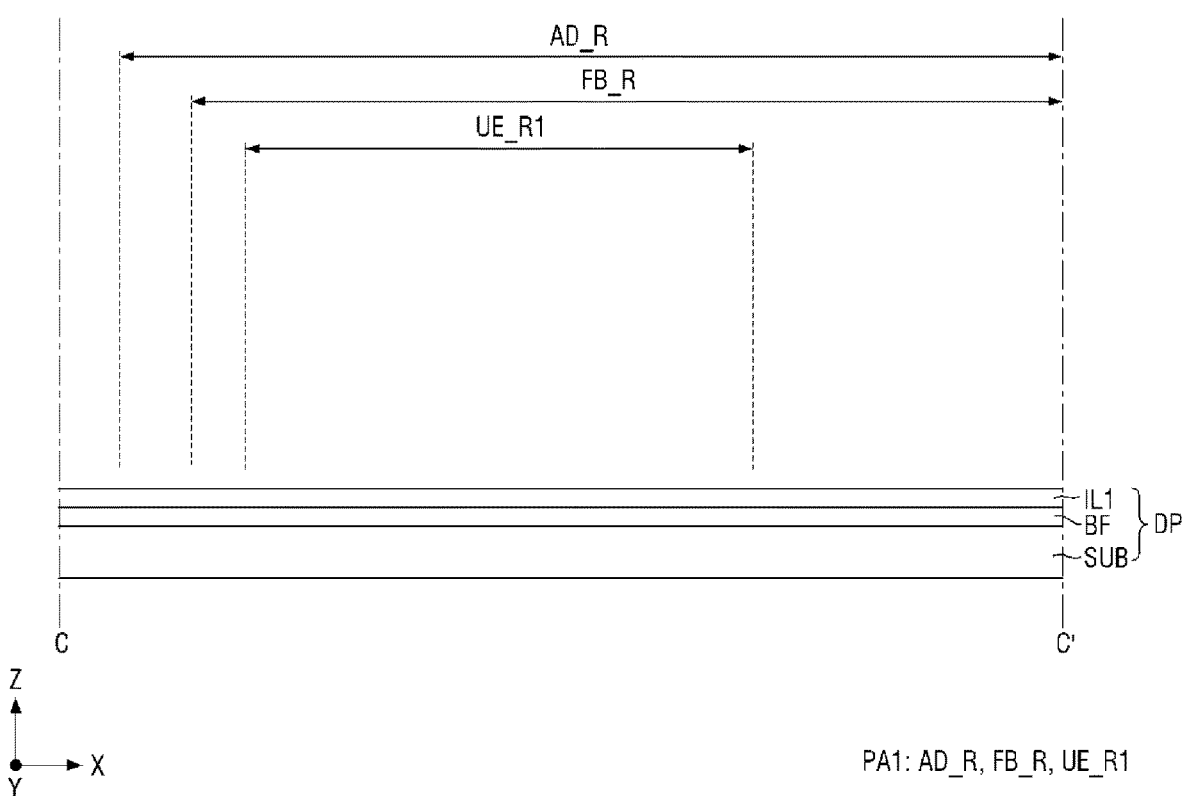
FIGS. 10, 11, 12, 13, 14, and 15 are views showing processing steps of a method of fabricating a display device according to an embodiment of the present disclosure.

FIG. 9 is a flowchart for illustrating a method for fabricating a display device according to an embodiment of the present disclosure. FIGS. 10, 11, 12, 13, 14, and 15 are views showing processing steps of a method of fabricating a display device according to an embodiment of the present disclosure.

Referring to FIG. 9, a method for fabricating a display device according to an embodiment may include steps of forming a plurality of grooves in a display panel DP, disposing an adhesive member AD on a plurality of pad electrodes PE and the plurality of grooves of the display panel DP, and attaching the display panel DP to the printed circuit board FB by the adhesive member AD.

The method of fabricating a display device is not limited to the above-described embodiment, and at least some of the above steps may be omitted, or one or more steps may be added according to other embodiments of the present disclosure.

Hereinafter, a method for fabricating a display device will be described in detail with reference to FIGS. 10, 11, 12, 13, 14, and 15.

Referring to FIGS. 2, 3, 4, 5, 6, 7, 8, 9, and 10, a first substrate SUB1 may be prepared. A bottom conductive layer BML, a buffer layer BF, a semiconductor layer ACT and a first insulating layer IL1 may be sequentially formed on the first substrate SUB1. In this instance, only the buffer layer BF and the first insulating layer IL1 may be formed in the first connection area PA1 where the printed circuit board FB is attached. As shown in FIGS. 1 and 2, the buffer layer BF and the first insulating layer IL1 may be equally formed in the first connection area PA1 where the printed circuit board FB is attached and the other remaining areas.

Figure 11:
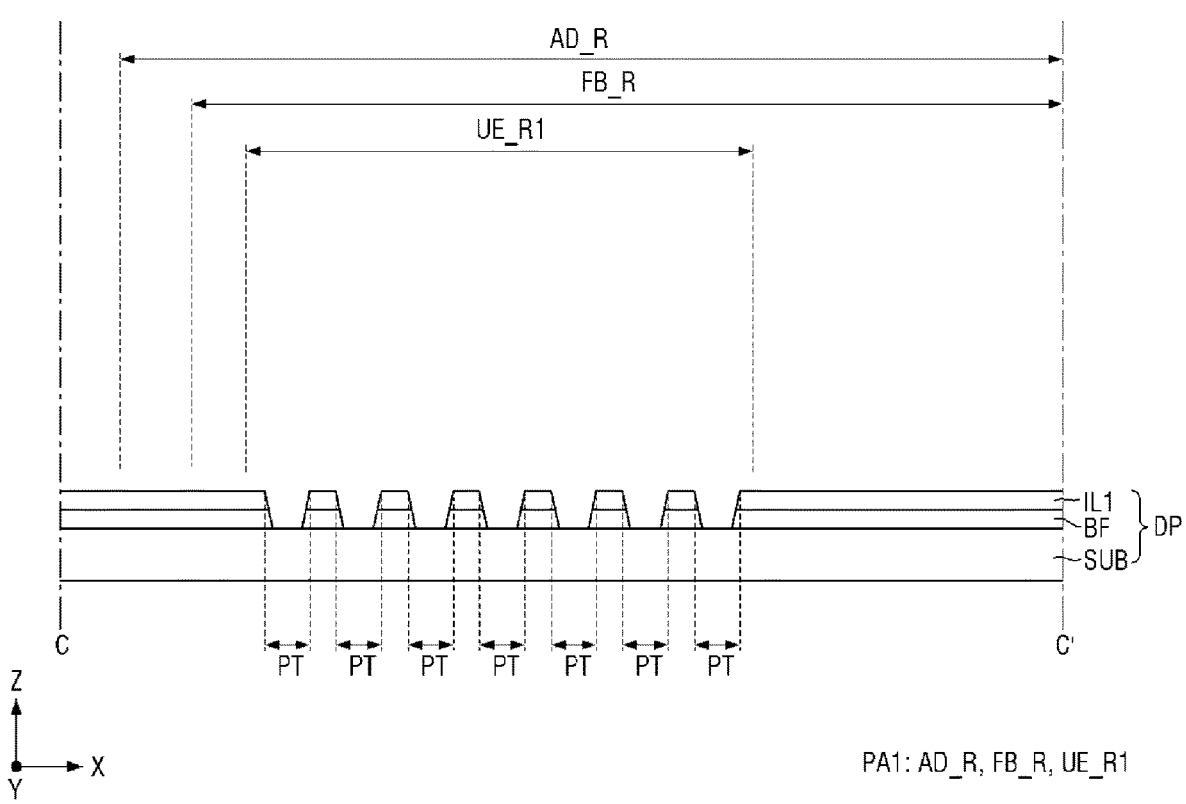

Subsequently, referring to FIG. 11, a plurality of penetration holes PT passing through at least one insulating layer may be formed in the first pattern region UE_R1. According to an embodiment of the present disclosure, the buffer layer BF and the first insulating layer IL1 are illustrated as the at least one insulating layer, but the present disclosure is not limited thereto.

The plurality of penetration holes PT may be formed by, for example, wet etching or dry etching. As a result, a pattern having a concave-convex shape may be formed in the first pattern region UE_R1. Although not shown in the drawings, the plurality of penetration holes PT may be formed to penetrate only the first insulating layer IL1.

Figure 12:
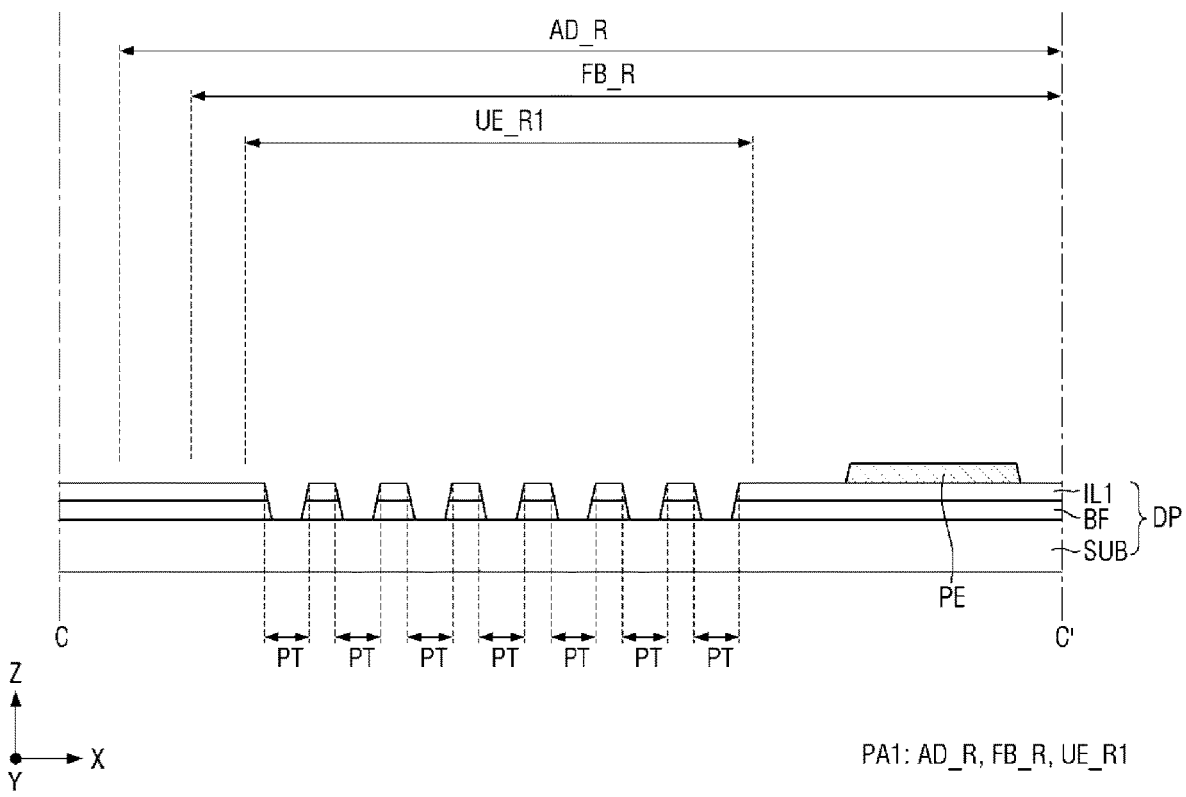

Subsequently, referring to FIG. 12, a pad electrode PE may be formed on the first substrate SUB1. The pad electrode PE may be formed at a position adjacent to the first pattern region UE_R1. The pad electrode PE may be formed on the first insulating layer IL1, but the present disclosure is not limited thereto. The pad electrode PE may be formed via, for example, a deposition process using a mask.

Referring to FIGS. 1 and 2, the pad electrode PE may be formed simultaneously with the source electrode SE and the drain electrode DE. The pad electrode PE may be formed using the same mask as the mask for forming the source electrode SE and the drain electrode DE. Accordingly, the pad electrode PE, the source electrode SE and the drain electrode DE may be formed via a single process. It should be understood that the present disclosure is not limited thereto. The pad electrode PE may be formed simultaneously with the bottom conductive layer BML, the first conductive layer CDL1, the second conductive layer CDL2 or the fourth conductive layer CDL4.

Figure 13:
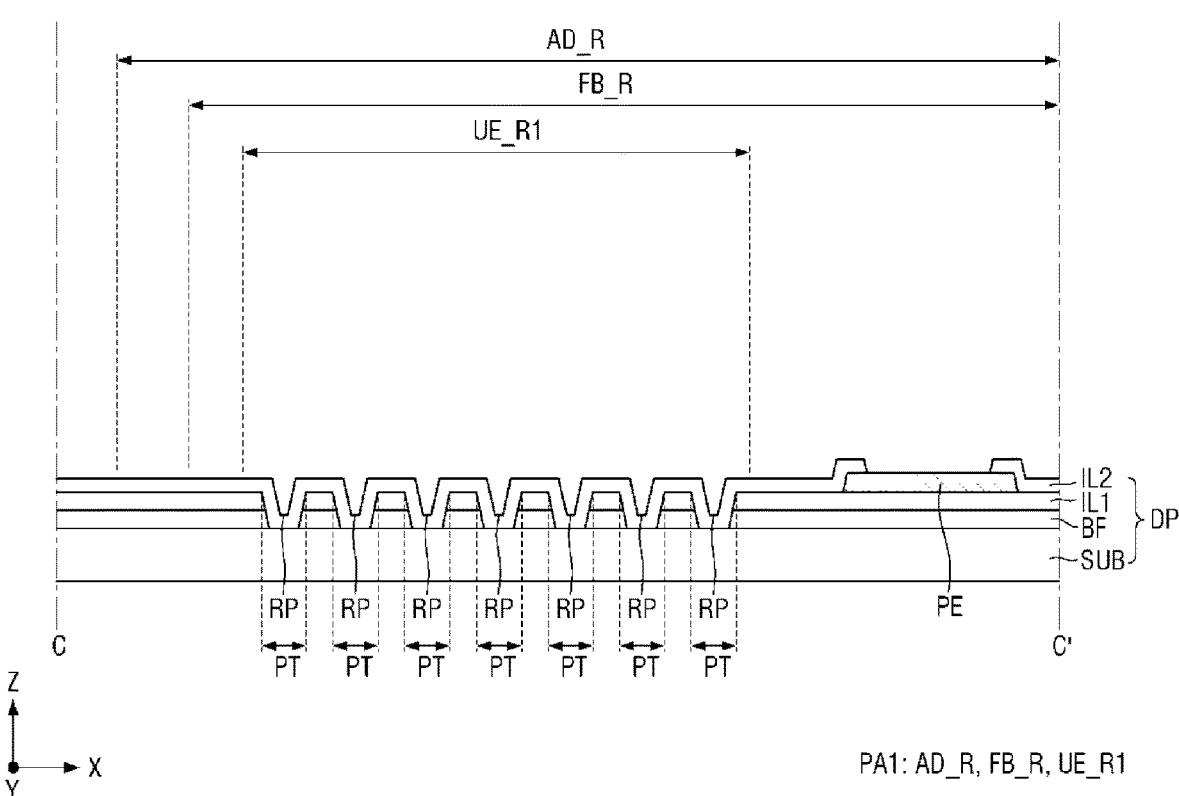

Referring to FIG. 13, a second insulating layer IL2 may be formed on the first insulating layer IL1 in the first connection area PA1. Subsequently, a part of the second insulating layer IL2 on the pad electrode PE may be etched to expose a part of the pad electrode PE.

Referring to FIGS. 1 and 2, the second insulating layer IL2 may be formed after the first conductive layer CDL1, the first insulating layer IL1 and the second conductive layer CDL2 in the display area DA have been formed.

The second insulating layer IL2 may be formed to cover the plurality of penetration holes PT. As the second insulating layer IL2 is formed to have a relatively uniform thickness, a plurality of grooves RP may be formed on the upper surface of the second insulating layer IL2. Although not shown in the drawings, the via layer VIA may be further formed on the second insulating layer IL2, as described above.

Figure 14:
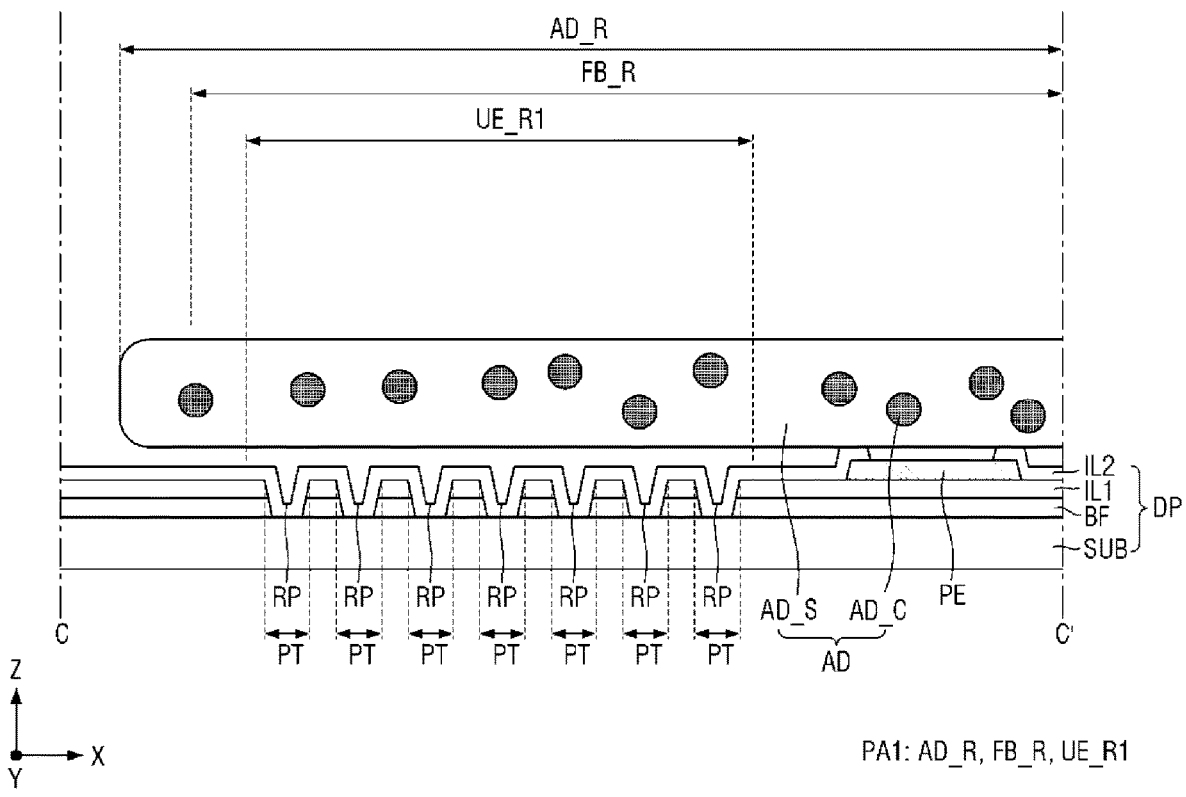

Subsequently, referring to FIG. 14, the adhesive member AD may be disposed in the first region AD_R. As described above, the adhesive member AD may include the base resin AD_S and the conductive particles AD_C. Although not shown in the drawings, the conductive particles AD_C may be eliminated.

The adhesive member AD may be disposed to cover the plurality of grooves RP and the pad electrode PE. The adhesive member AD may be a film-type member and may be attached to the first region AD_R. Alternatively, it may have viscosity and may be applied to the first region AD_R. It should be understood that the present disclosure is not limited thereto.

Figure 15:
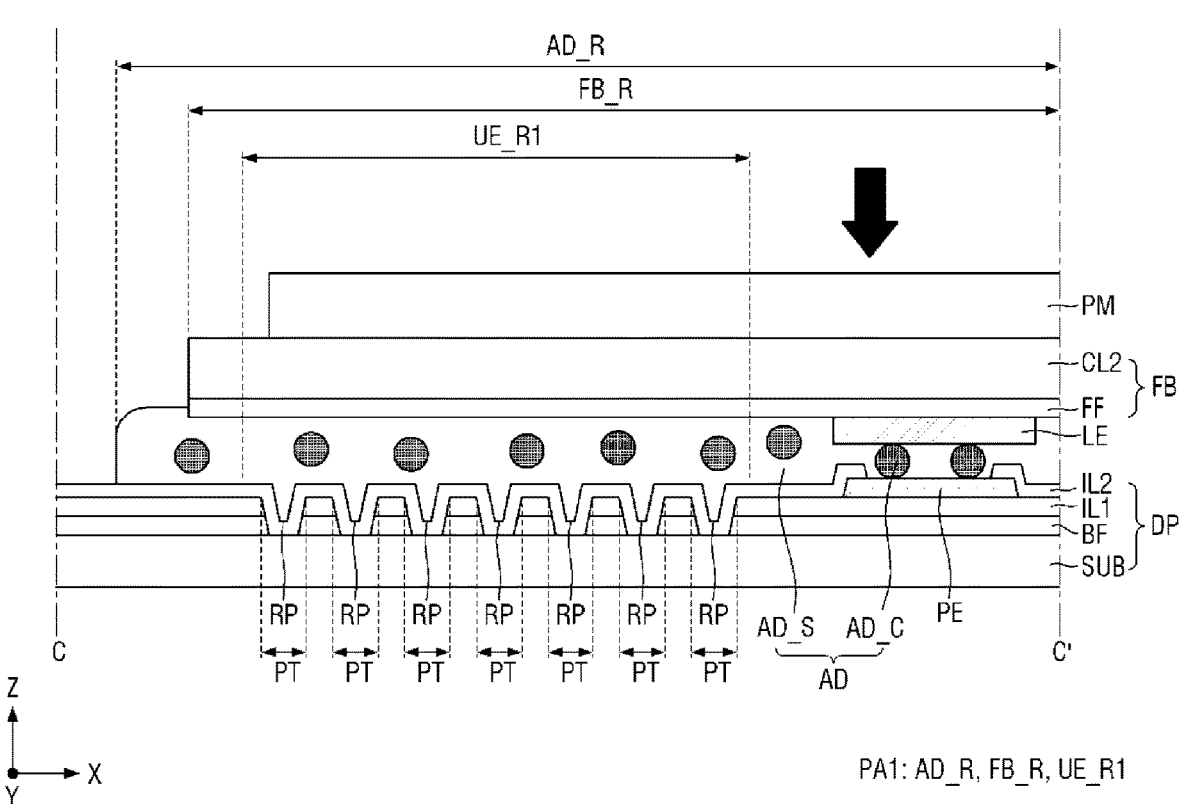

Subsequently, referring to FIG. 15, a printed circuit board FB may be disposed in a second region FB_R. The printed circuit board FB may be disposed on the adhesive member AD. The adhesive member AD may be disposed on the printed circuit board FB and the display panel DP.

Subsequently, the display panel DP and the printed circuit board FB may be attached together by the adhesive member AD. For example, the display panel DP and the printed circuit board FB may be compressed by a pressing member PM. The pressure member PM may include a heating element for melting the base resin AD_S of the adhesive member AD, and the display panel DP and the printed circuit board FB may be thermocompression bonded by the pressing member PM. It should be understood that the present disclosure is not limited thereto. Although not shown in the drawings, when the conductive particles AD_C are eliminated, ultrasonic waves may be applied to the pad electrode PE of the display panel DP and the lead electrode LE of the printed circuit board FB, so that they may be directly attached together.

When the display panel DP and the printed circuit board FB are attached together, the base resin AD_S of the adhesive member AD may be deformed, for example, melted so that the plurality of grooves RP may be filled with it. By doing so, the adhesion area of the adhesive member AD can be increased to enhance the adhesive force of the adhesive member AD. In addition, it is possible to prevent the issue of reliability and/or driving failure due to delamination of the printed circuit board FB.

In the display device 1 and the method for fabricating the display device according to the embodiment, the pad electrodes PE are formed simultaneously with a conductive layer disposed under an inorganic layer having a thin thickness, for example, the second conductive layer disposed under the second insulating layer IL2, and the pad electrodes PE are exposed through the second insulating layer IL2, so that it is possible to suppress compression defects caused by a level difference formed around the pad electrodes PE, etc. In addition, the adhesion area of the adhesive member AD increase by forming the plurality of penetration holes PT and the plurality of grooves RP, and the plurality of penetration holes PT are covered with the second insulating layer IL2, so that it is possible to prevent direct contact between the base resin AD_S and the first substrate SUB1 having a relatively low adhesive force with respect to the resin AD_S. In this manner, the adhesive force of the adhesive member AD can increase. Accordingly, it is possible to prevent the issue of reliability or driving failure of the display device 1 due to delamination of the printed circuit board FB.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device comprising:
a display panel;
a printed circuit film; and
an adhesive member interposed between the display panel and the printed circuit film,
wherein the display panel includes an insulating layer and a plurality of grooves overlapping the adhesive member in a thickness direction of the display device and disposed on a surface of the insulating layer,
wherein each of the plurality of grooves is filled with the adhesive member,
wherein a portion of the insulating layer overlaps the plurality of grooves,
wherein the portion of the insulating layer which overlaps the plurality of grooves directly contacts the adhesive member, and wherein the display panel further includes a first insulating layer and a plurality of pad electrodes disposed between the first insulating layer and the insulating layer.

2. The display device of claim 1, wherein the display panel includes a first region where the adhesive member is attached, and a second region where the printed circuit film is attached,
wherein the second region at least partially overlaps the first region, and
wherein the plurality of grooves overlaps the first region and the second region at least partially.

3. The display device of claim 2, wherein the plurality of grooves overlaps at least one of a boundary of the first region and a boundary of the second region.

4. The display device of claim 3, wherein the boundary of the first region includes both longer sides in a first direction, and
wherein the plurality of grooves overlaps one of the both longer sides that is adjacent to an edge of the display panel.

5. The display device of claim 2, wherein the plurality of pad electrodes are disposed where the first region and the second region overlap each other, and
wherein the plurality of grooves are spaced apart from each other in a first direction in which the plurality of pad electrodes are arranged in a plan view.

6. The display device of claim 5, wherein a width of the first region in the first direction is greater than a width of the second region in the first direction.

7. The display device of claim 5, further comprising at least one alignment mark disposed between at least one of the plurality of pad electrodes and at least one of the plurality of grooves in the plan view.

8. The display device of claim 1, wherein the display panel includes a first substrate, a buffer layer disposed on the first substrate, the first insulating layer disposed on the buffer layer, and a plurality of penetration holes passing through the buffer layer and the first insulating layer, and
wherein the insulating layer is disposed on the first insulating layer to cover the plurality of penetration holes.

9. The display device of claim 8,
wherein the plurality of grooves are disposed on the surface of the insulating layer to overlap the penetration holes, respectively.

10. The display device of claim 1, wherein the plurality of grooves are extended in a direction crossing an edge of the display panel overlapping the printed circuit film in a plan view.

11. The display device of claim 1, further comprising
a color conversion member disposed to overlap the display panel,
wherein the color conversion member includes a wavelength shifter for converting a peak wavelength of incident light into a certain peak wavelength.

12. A display device comprising:
a display panel;
a printed circuit film; and
an adhesive member interposed between the display panel and the printed circuit film,
wherein the display panel includes an insulating layer and a plurality of grooves overlapping the adhesive member in a thickness direction of the display device and disposed on a surface of the insulating layer,
wherein the display panel includes a first region where the adhesive member is attached, a second region where the printed circuit film is attached, a plurality of pad electrodes disposed where the first region and the second region overlap each other, a source electrode, and a drain electrode, wherein the insulating layer is disposed on the source electrode and the drain electrode and includes an inorganic insulating material, wherein each of the plurality of grooves is filled with the adhesive member, wherein the second region at least partially overlaps the first region, wherein the plurality of grooves overlaps the first region and the second region at least partially, wherein the plurality of grooves are spaced apart from each other in a first direction in which the plurality of pad electrodes are arranged in a plan view, and wherein the plurality of pad electrodes are formed simultaneously with the source electrode and the drain electrode, and at least some portions of edges of the pad electrodes are covered by the insulating layer.

13. A display device comprising:
a display panel;
a printed circuit film; and an adhesive member interposed between the display panel and the printed circuit film, wherein the display panel includes a pad electrode and a first pattern region that overlaps the adhesive member in a thickness direction of the display device, spaced apart from the pad electrode in a plan view and having a concave-convex surface, wherein the first pattern region includes a plurality of penetration holes passing through at least one insulating layer, an additional insulating layer which covers the plurality of penetration holes and a plurality of grooves disposed above the additional insulating layer, wherein a portion of the additional insulating layer which overlaps the plurality of penetration holes directly contacts the adhesive member.

14. The display device of claim 13, wherein the adhesive member includes a base resin and conductive particles dispersed in the base resin, and wherein the plurality of grooves are filled with the base resin.

15. The display device of claim 13, wherein the first pattern region overlaps with an edge of the adhesive member in the plan view.

* * * * *